US008107286B2

(12) United States Patent
Itagaki et al.

(10) Patent No.: US 8,107,286 B2
(45) Date of Patent: Jan. 31, 2012

(54) THREE-DIMENSIONAL NONVOLATILE SEMICONDUCTOR MEMORY DEVICE FOR CURBING A LEAK CURRENT AND METHOD OF DATA READ THEREIN

(75) Inventors: Kiyotaro Itagaki, Naka-gun (JP); Yoshiaki Fukuzumi, Yokohama (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 12/684,349

(22) Filed: Jan. 8, 2010

(65) Prior Publication Data
US 2011/0069552 A1 Mar. 24, 2011

(30) Foreign Application Priority Data
Sep. 18, 2009 (JP) ................. 2009-216403

(51) Int. Cl.
*G11C 16/26* (2006.01)
(52) U.S. Cl. .......... 365/185.02; 365/185.18; 365/185.17
(58) Field of Classification Search ............. 365/185.17, 365/185.18, 185.02
See application file for complete search history.

(56) References Cited

U.S. PATENT DOCUMENTS

| 2007/0252201 A1 | 11/2007 | Kito et al. |
| 2009/0294844 A1 | 12/2009 | Tanaka et al. |
| 2011/0069552 A1* | 3/2011 | Itagaki et al. ............ 365/185.18 |
| 2011/0103153 A1 | 5/2011 | Katsumata |

FOREIGN PATENT DOCUMENTS

| JP | 2007-266143 | 10/2007 |
| JP | 2009-146954 | 7/2009 |
| WO | WO 2009/075370 A1 | 6/2009 |
| WO | WO 2010/035609 A1 | 4/2010 |

OTHER PUBLICATIONS

H. Tanaka et al., "Bit Cost Scalable Technology with Punch and Plug Process for Ultra High Density Flash Memory", 2007 Symposium on VLSI Technology Digest of Technical Papers, Jun. 2007, pp. 14-15.
Yoshiaki Fukuzumi et al., "Optimal Integration and Characteristics of Vertical Array Devices for Ultra-High Density, Bit-Cost Scalable Flash Memory", Electron Devices Meeting 2007, Dec. 2007, pp. 449-452.
U.S. Appl. No. 12/679,991, filed Mar. 25, 2010, Fukuzumi et al.

* cited by examiner

*Primary Examiner* — Andrew Q Tran
(74) *Attorney, Agent, or Firm* — Oblon, Spivak, McClelland, Maier & Neustadt, L.L.P.

(57) ABSTRACT

A nonvolatile semiconductor memory device comprises: a memory cell array having a plurality of memory strings each having a plurality of memory cells connected in series; and a control circuit configured to execute a read operation for reading data from the memory cells included in a selected memory string from among the plurality of memory strings. During the read operation, the control circuit is configured to apply a first voltage to a gate of at least one of the memory cells in a non-selected memory string not subject to the read operation, and apply a second voltage lower than the first voltage to a gate of another of the memory cells in the non-selected memory string not subject to the read operation.

20 Claims, 23 Drawing Sheets

THREE-DIMENSIONAL NONVOLATILE SEMICONDUCTOR MEMORY DEVICE FOR CURBING A LEAK CURRENT AND METHOD OF DATA READ THEREIN

CROSS REFERENCE TO RELATED APPLICATIONS

This application is based upon and claims the benefit of priority from prior Japanese Patent Application No. 2009-216403, filed on Sep. 18, 2009, the entire contents of which are incorporated herein by reference.

BACKGROUND OF THE INVENTION

1. Field of the Invention

The present invention relates to an electrically data-rewritable nonvolatile semiconductor memory device and a method of data read therein.

2. Description of the Related Art

As miniaturization technology approaches its limit, much is expected from stacking of memory cells as a way of improving bit density in nonvolatile semiconductor memory devices such as NAND flash memory. As an example, there is proposed a stacking-type NAND flash memory configured by a memory cell using a vertical-type transistor (refer to, for example, Japanese Unexamined Patent Application Publication No. 2007-266143). Operation, including a read operation, of the stacking-type NAND flash memory is substantially the same as operation of a conventional planar-type NAND flash memory. Consequently, when attempting to increase a capacity of the stacking-type NAND flash memory, it is important that, during read, a leak current from a non-selected memory string which is not subject to the read operation is curbed.

Conventionally, a NAND flash memory curbs the leak current from a non-selected memory string by applying a ground potential or a negative potential to a gate of a select transistor connected to the non-selected memory string. Moreover, conventionally, a NAND flash memory solves the above-described problem by decreasing a number of memory strings connected to one bit line. In recent years, there is a need to further increase curbing of the leak current, in addition to the conventional technology.

SUMMARY OF THE INVENTION

In accordance with a first aspect of the present invention, a nonvolatile semiconductor memory device, comprising: a memory cell array having a plurality of memory strings each including a plurality of memory cells connected in series; and a control circuit configured to execute a read operation for reading data from the memory cells included in a selected memory string from among the plurality of memory strings, each of the memory strings comprising: a semiconductor layer having a columnar portion extending in a perpendicular direction with respect to a substrate and functioning as a body of the memory cells; a charge storage layer surrounding the columnar portion and holding data by storing a charge; and a first conductive layer surrounding the columnar portion with the charge storage layer sandwiched therebetween, extending in parallel to the substrate, and functioning as a gate of the memory cells, the control circuit being configured to apply a first voltage to a gate of at least one of the memory cells in a non-selected memory string not subject to the read operation, and apply a second voltage lower than the first voltage to a gate of another of the memory cells in the non-selected memory string not subject to the read operation, during the read operation.

In accordance with a second aspect of the present invention, a nonvolatile semiconductor memory device, comprising: a memory cell array having a plurality of memory strings each including a plurality of memory cells connected in series; and a control circuit configured to execute a read operation for reading data from the memory cells included in a selected memory string from among the plurality of memory strings, each of the memory strings comprising: a semiconductor layer having a columnar portion extending in a perpendicular direction with respect to a substrate and functioning as a body of the memory cells; a charge storage layer surrounding the columnar portion and holding data by storing a charge; a first conductive layer surrounding the columnar portion with the charge storage layer sandwiched therebetween, extending in parallel to the substrate, and functioning as a gate of the memory cells; a joining portion joining lower ends of a pair of the columnar portions in the semiconductor layer and functioning as a body of a back gate transistor; and a second conductive layer surrounding the joining portion with the charge storage layer sandwiched therebetween, extending in parallel to the substrate, and functioning as a gate of the back gate transistor, the control circuit being configured to apply a first voltage to a gate of the back gate transistor in a non-selected memory string not subject to the read operation, and apply a second voltage lower than the first voltage to a gate of the memory cells in the non-selected memory string not subject to the read operation, during the read operation.

In accordance with a third aspect of the present invention, a method of data read in a nonvolatile semiconductor memory device, the nonvolatile semiconductor memory device comprising a memory cell array having a plurality of memory strings each including a plurality of memory cells connected in series, each of the memory strings comprising: a semiconductor layer having a columnar portion extending in a perpendicular direction with respect to a substrate and functioning as a body of the memory cells; a charge storage layer surrounding the columnar portion and holding data by storing a charge; and a first conductive layer surrounding the columnar portion with the charge storage layer sandwiched therebetween, extending in parallel to the substrate, and functioning as a gate of the memory cells, the method comprising: applying a first voltage to a gate of at least one of the memory cells in a non-selected memory string not subject to a read operation, and applying a second voltage lower than the first voltage to a gate of another of the memory cells in the non-selected memory string not subject to the read operation, during execution of the read operation for reading data from the memory cells included in a selected memory string from among the plurality of memory strings.

BRIEF DESCRIPTION OF THE DRAWINGS

FIG. 6 is a circuit diagram showing a boost circuit 12a.

FIG. 7A is a timing chart showing operation of the boost circuit 12a.

FIG. 7B is a timing chart showing operation of the boost circuit 12a.

FIG. 8 is a circuit diagram showing a word line drive circuit 13a.

FIG. 10 is a circuit diagram showing a select gate line drive circuit 15a.

DETAILED DESCRIPTION OF THE EMBODIMENTS

First Embodiment

Configuration

Figure 1:
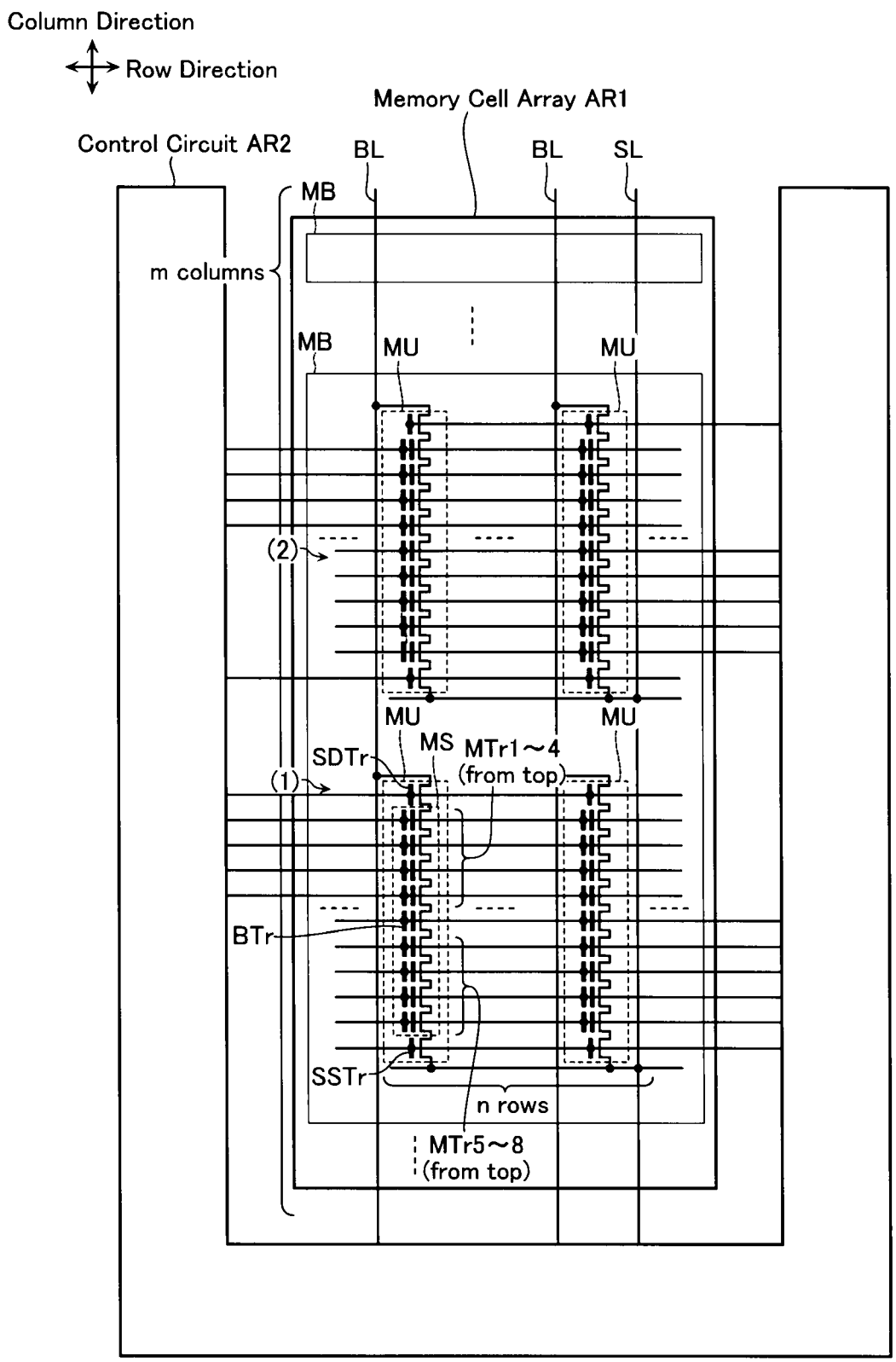
FIG. 1 is a circuit diagram of a nonvolatile semiconductor memory device in accordance with a first embodiment of the present invention.

First, an overall configuration of a nonvolatile semiconductor memory device in accordance with a first embodiment is described with reference to FIG. 1. FIG. 1 is a circuit diagram of the nonvolatile semiconductor memory device in accordance with the first embodiment.

As shown in FIG. 1, the nonvolatile semiconductor memory device in accordance with the first embodiment includes a memory cell array AR1 and a control circuit AR2 provided at a periphery of the memory cell array AR1.

As shown in FIG. 1, the memory cell array AR1 is configured to have a plurality of memory strings MS each having electrically rewritable memory transistors MTr1-MTr8 (memory cells) connected in series. The control circuit AR2 is configured by various kinds of control circuits configured to control a voltage applied to a gate and so on of the memory transistors MTr (MTr1-MTr8). The control circuit AR2 executes a write operation for writing data to the memory transistors MTr, an erase operation for erasing data in the memory transistors MTr, and a read operation for reading data from the memory transistors MTr. During the write operation and the read operation, a voltage applied to a selected memory string MS is substantially similar to a conventional stacking-type flash memory.

However, during the read operation, the control circuit AR2 applies a read pass voltage Vread to a gate of at least one of the memory transistors MTr included in a non-selected memory string MS, and a ground potential Vss (0 V) to another memory transistor MTr included in the non-selected memory string MS. The read pass voltage Vread is identical to a voltage applied to a gate of a non-selected memory transistor MTr in the selected memory string MS and renders the memory transistor MTr conductive irrespective of stored data in the memory transistor MTr. A potential of a body of the memory transistor MTr that has the read pass voltage Vread applied thereto becomes lower than a potential of a body of the other memory transistor MTr that has the ground voltage Vss applied to a gate thereof, in proportion to an amount of inversion layer formed. A potential difference of this kind causes a well-type potential to be formed in the non-selected memory string MS, thereby enabling a leak current in the non-selected memory string MS to be curbed.

As shown in FIG. 1, the memory cell array AR1 includes m columns of memory blocks MB. Each memory block MB includes n rows by 2 columns of memory units MU. The memory unit MU comprises the memory string MS, a source side select transistor SSTr connected to one end of the memory string MS, and a drain side select transistor SDTr connected to the other end of the memory string MS. Note that, in the example shown in FIG. 1, a first column of the memory units MU is labeled (1), and a second column of the memory units MU is labeled (2). A bit line BL and a source line SL are shared by the m columns of memory blocks MB.

Figure 2:
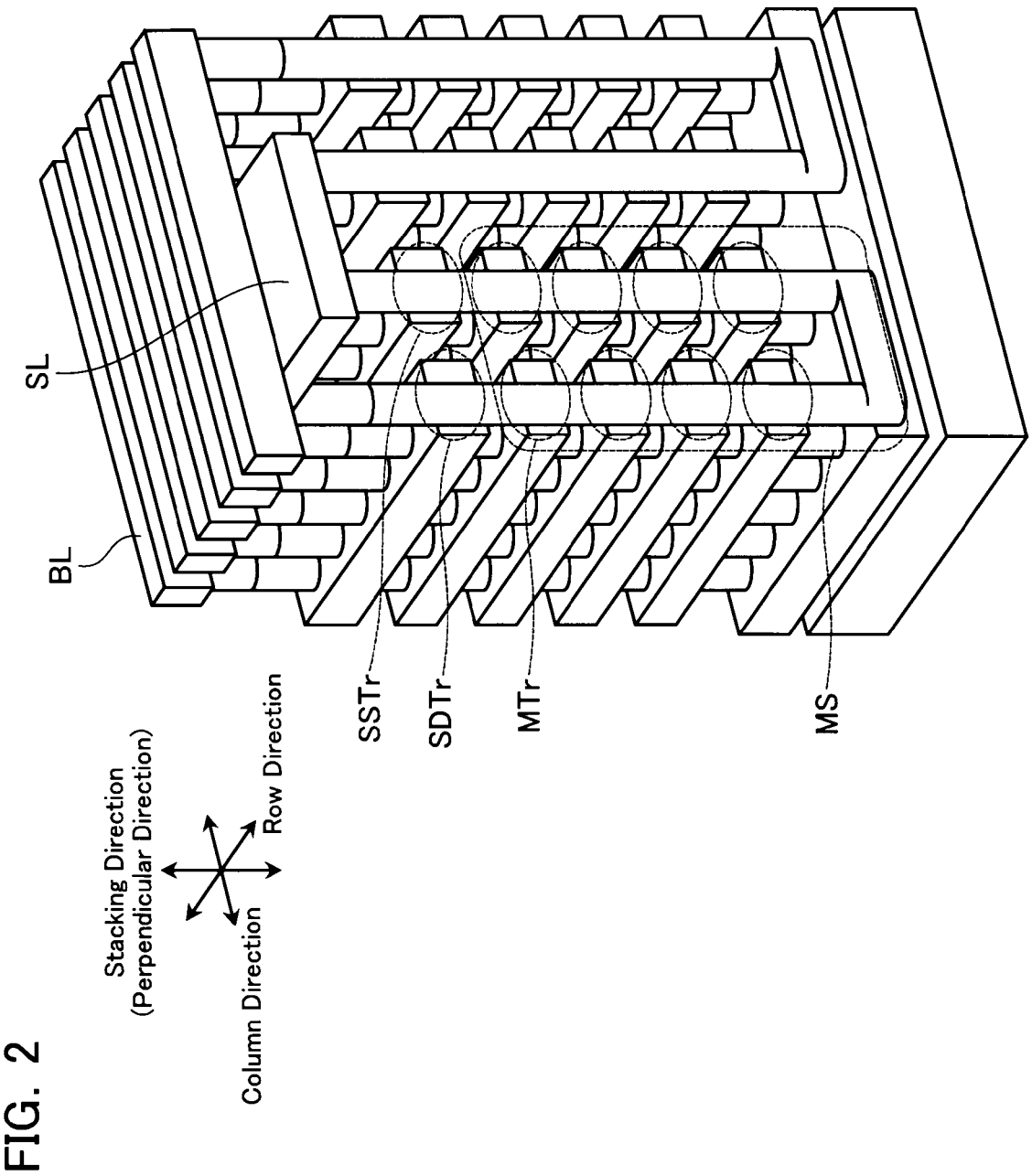
FIG. 2 is a schematic perspective view showing a memory cell array AR1.

As shown in FIG. 2, the memory cell array AR1 is configured to have the electrically data-storing memory transistors MTr arranged in a three-dimensional matrix. That is, as well as being arranged in a matrix in a horizontal direction, the memory transistors MTr are arranged also in a stacking direction (a perpendicular direction with respect to a substrate). A plurality of the memory transistors MTr lined up in the stacking direction are connected in series to configure the memory string MS. The source side select transistor SSTr and the drain side select transistor SDTr which are selectively rendered conductive are connected to both ends of the memory string MS, respectively. The memory string MS is arranged to be long in the stacking direction. Note that a detailed stacking structure is described hereafter.

Figure 3:
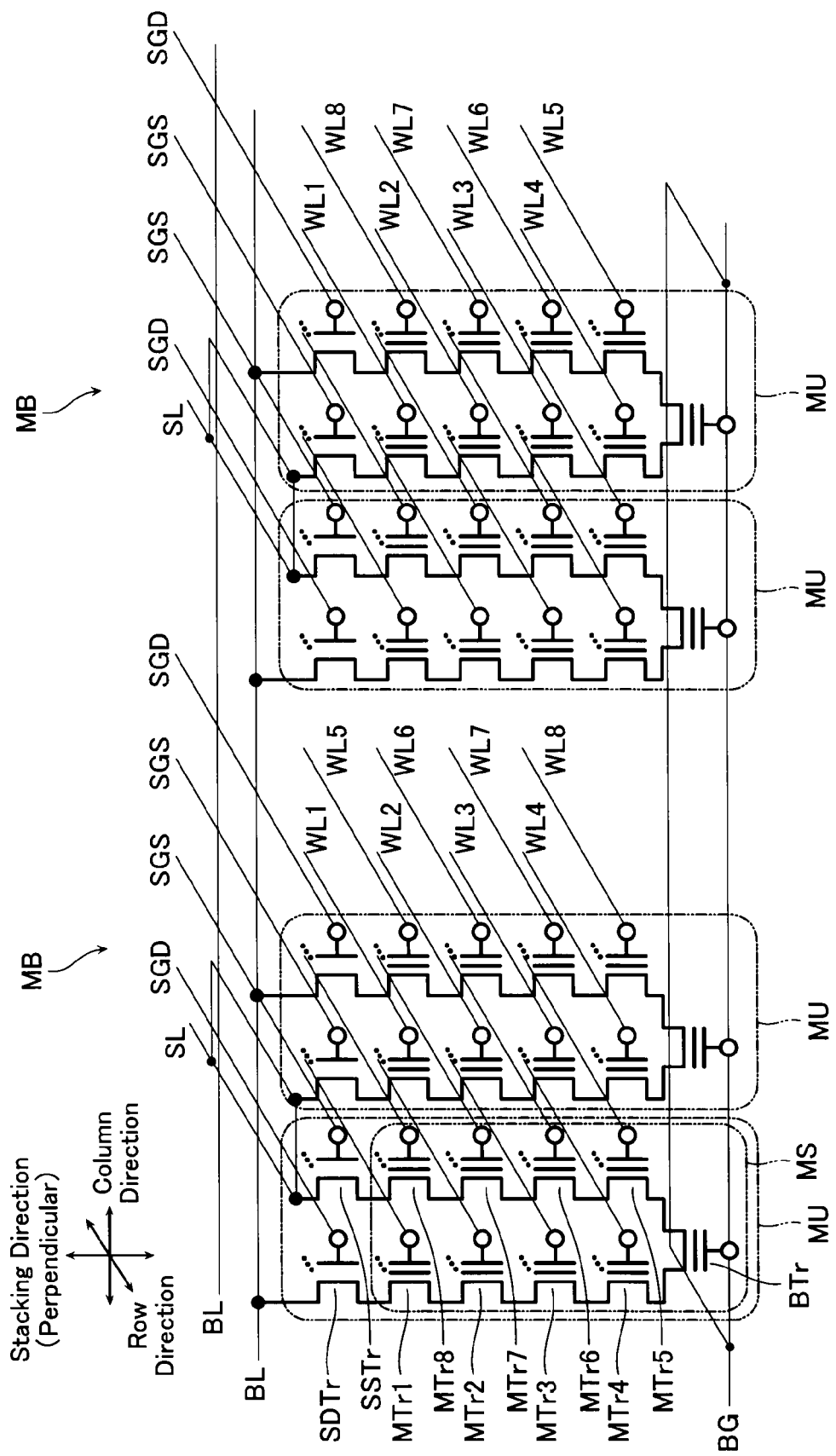
FIG. 3 is an equivalent circuit diagram of the memory cell array AR1.

Next, a circuit configuration of the memory cell array AR1 is described specifically with reference to FIG. 3. FIG. 3 is an equivalent circuit diagram of the memory cell array AR1.

As shown in FIG. 3, the memory cell array AR1 includes a plurality of the bit lines BL and a plurality of the memory blocks MB. The bit line BL is formed in stripes extending in a column direction and having a certain pitch in a row direction. The memory block MB is provided repeatedly in the column direction with a certain pitch.

As shown in FIG. 3, the memory block MB includes a plurality of the memory units MU arranged in a matrix in the row direction and the column direction. A plurality of the memory units MU are provided so that the plurality of the memory units MU are commonly connected to one bit line BL. The memory unit MU includes the memory string MS, the source side select transistor SSTr, and the drain side select transistor SDTr. The memory units MU mutually adjacent in the column direction are formed such that a configuration thereof is mutually symmetrical in the column direction. The memory units MU are arranged in a matrix in the row direction and the column direction.

The memory string MS is configured by the memory transistors MTr1-MTr8 and a back gate transistor BTr connected in series. The memory transistors MTr1-MTr4 are connected in series in the stacking direction. The memory transistors MTr5-MTr8 also are similarly connected in series in the stacking direction. The memory transistors MTr1-MTr8 store information by trapping a charge in a charge storage layer. The back gate transistor BTr is connected between the lowermost layer memory transistors MTr4 and MTr5. The memory transistors MTr1-MTr8 and the back gate transistor BTr are thus connected in a U shape in a cross-section in the column direction. A source of the drain side select transistor SDTr is connected to one end of the memory string MS (a drain of the memory transistor MTr1). A drain of the source side select transistor SSTr is connected to the other end of the memory string MS (a source of the memory transistor MTr8).

Gates of the memory transistors MTr1 in the memory units MU arranged in a line in the row direction are commonly connected to a word line WL1 extending in the row direction. Similarly, gates of the memory transistors MTr2-MTr8 respectively arranged in lines in the row direction are commonly connected to respective word lines WL2-WL8 extending in the row direction. Note that the two memory strings MS adjacent in the column direction also share the word lines WL1-WL8. Moreover, gates of the back gate transistors BTr arranged in a matrix in the row direction and the column direction are commonly connected to a back gate line BG.

Gates of each of the drain side select transistors SDTr in the memory units MU arranged in a line in the row direction are commonly connected to a drain side select gate line SGD extending in the row direction. Moreover, drains of the drain side select transistors SDTr arranged in a line in the column direction are commonly connected to the bit line BL extending in the column direction.

Gates of each of the source side select transistors SSTr in the memory units MU arranged in a line in the row direction are commonly connected to a source side select gate line SGS extending in the row direction. Moreover, sources of the source side select transistors SSTr in pairs of the memory units MU mutually adjacent in the column direction arranged in a line in the row direction are commonly connected to the source line SL extending in the row direction.

Figure 4:
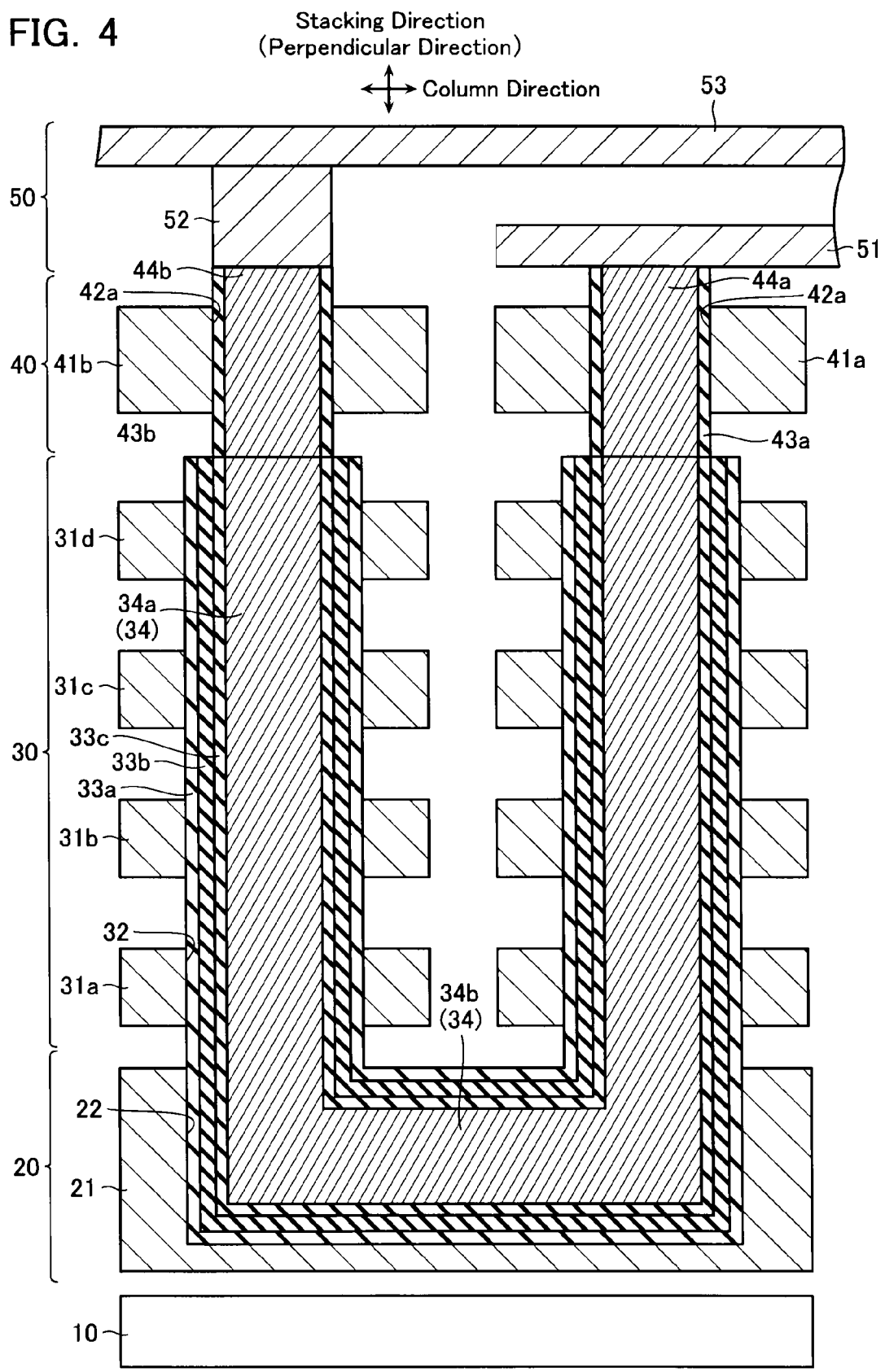
FIG. 4 is a partial cross-sectional view of the memory cell array AR1.

Next, the stacking structure of the nonvolatile semiconductor memory device in accordance with the first embodiment is described with reference to FIG. 4. FIG. 4 is a partial cross-sectional view of the memory cell array AR1.

As shown in FIG. 4, the memory cell array AR1 includes, on a substrate 10, a back gate transistor layer 20, a memory transistor layer 30, a select transistor layer 40, and a wiring layer 50. The back gate transistor layer 20 functions as the back gate transistor BTr. The memory transistor layer 30 functions as the memory transistors MTr1-MTr8 (memory string MS). The select transistor layer 40 functions as the source side select transistor SSTr and the drain side select transistor SDTr. The wiring layer 50 functions as the source line SL and the bit line BL.

The back gate transistor layer 20 includes a back gate conductive layer 21, as shown in FIG. 4. The back gate conductive layer 21 functions as the back gate line BG. In addition, the back gate conductive layer 21 functions as the back gate transistor BTr.

The back gate conductive layer 21 is formed so as to extend two-dimensionally in the row direction and the column direction parallel to the substrate. The back gate conductive layer 21 is divided into memory blocks MB. The back gate conductive layer 21 is constituted by polysilicon (poly-Si).

The back gate transistor layer 20 includes a back gate hole 22, as shown in FIG. 4. The back gate hole 22 is formed so as to dig out the back gate conductive layer 21. The back gate hole 22 is formed in a substantially rectangular shape long in the column direction as viewed from an upper surface. The back gate hole 22 is formed in a matrix in the row direction and the column direction.

The memory transistor layer 30 is formed on an upper surface of the back gate transistor layer 20, as shown in FIG. 4. The memory transistor layer 30 includes word line conductive layers 31*a*-31*d*. The word line conductive layers 31*a*-31*d* function as the word lines WL1-WL8. In addition, the word line conductive layers 31*a*-31*d* function as gates of the memory transistors MTr1-MTr8.

The word line conductive layers 31*a*-31*d* are stacked sandwiching an interlayer insulating layer (not shown) therebetween. The word line conductive layers 31*a*-31*d* are formed so as to extend in the row direction with a certain pitch in the column direction along a certain region. The word line conductive layers 31*a*-31*d* are constituted by polysilicon (poly-Si).

The memory transistor layer 30 includes a memory hole 32, as shown in FIG. 4. The memory hole 32 is formed so as to penetrate the word line conductive layers 31*a*-31*d*. The memory hole 32 is formed so as to align with an end vicinity in the column direction of the back gate hole 22.

In addition, the back gate transistor layer 20 and the memory transistor layer 30 include a block insulating layer 33*a*, a charge storage layer 33*b*, a tunnel insulating layer 33*c*, and a U-shaped semiconductor layer 34, as shown in FIG. 4. The block insulating layer 33*a*, the charge storage layer 33*b*, the tunnel insulating layer 33*c*, and the U-shaped semiconductor layer 34 function as the MONOS of the memory transistors MTr1-MTr8. The charge storage layer 33*b* holds data by storing a charge. The U-shaped semiconductor layer 34 functions as a body of the memory string MS.

The block insulating layer 33*a* is formed with a certain thickness on a side wall of the back gate hole 22 and the memory hole 32, as shown in FIG. 4. The charge storage layer 33*b* is formed with a certain thickness on a side surface of the block insulating layer 33*a*. The tunnel insulating layer 33*c* is formed with a certain thickness on a side surface of the charge storage layer 33*b*. The U-shaped semiconductor layer 34 is formed so as to be in contact with a side surface of the tunnel insulating layer 33*c*. The U-shaped semiconductor layer 34 is formed so as to fill the back gate hole 22 and the memory hole 32. The U-shaped semiconductor layer 34 is formed in a U shape as viewed from the row direction. The U-shaped semiconductor layer 34 includes a pair of columnar portions 34*a* extending in the perpendicular direction with respect to the substrate 10 and a joining portion 34*b* configured to join lower ends of the pair of columnar portions 34*a*.

The block insulating layer 33*a* and the tunnel insulating layer 33*c* are constituted by silicon oxide ($SiO_2$). The charge storage layer 33*b* is constituted by silicon nitride (SiN). The U-shaped semiconductor layer 34 is constituted by polysilicon (poly-Si).

Expressing the above-described configuration of the back gate transistor layer 20 in other words, the tunnel insulating layer 33*c* is formed so as to surround the joining portion 34*b*. The back gate conductive layer 21 is formed so as to surround the joining portion 34*b*.

Expressing the above-described configuration of the memory transistor layer 30 in other words, the tunnel insulating layer 33c is formed so as to surround the columnar portion 34a. The charge storage layer 33b is formed so as to surround the tunnel insulating layer 33c. The block insulating layer 33a is formed so as to surround the charge storage layer 33b. The word line conductive layers 31a-31d are formed so as to surround the block insulating layer 33a and the columnar portion 34a.

The select transistor layer 40 includes a source side conductive layer 41a and a drain side conductive layer 41b, as shown in FIG. 4. The source side conductive layer 41a functions as the source side select gate line SGS. In addition, the source side conductive layer 41a functions as a gate of the source side select transistor SSTr. The drain side conductive layer 41b functions as the drain side select gate line SGD. In addition, the drain side conductive layer 41b functions as a gate of the drain side select transistor SDTr.

The source side conductive layer 41a and the drain side conductive layer 41b are formed in stripes extending in the row direction with a certain pitch in the column direction. A pair of the source side conductive layers 41a and a pair of the drain side conductive layers 41b are disposed alternately in the column direction. The source side conductive layer 41a is formed at an upper layer of one of the columnar portions 34a configuring the U-shaped semiconductor layer 34, and the drain side conductive layer 41b is formed at an upper layer of the other of the columnar portions 34a configuring the U-shaped semiconductor layer 34. The source side conductive layer 41a and the drain side conductive layer 41b are constituted by polysilicon (poly-Si).

The select transistor layer 40 includes a source side hole 42a and a drain side hole 42b, as shown in FIG. 4. The source side hole 42a is formed so as to penetrate the source side conductive layer 41a. The source side hole 42a is formed at a position aligning with the memory hole 32. The drain side hole 42b is formed so as to penetrate the drain side conductive layer 41b. The drain side hole 42b is formed at a position aligning with the memory hole 32.

The select transistor layer 40 includes a source side gate insulating layer 43a, a source side columnar semiconductor layer 44a, a drain side gate insulating layer 43b, and a drain side columnar semiconductor layer 44b, as shown in FIG. 4. The source side columnar semiconductor layer 44a functions as a body of the source side select transistor SSTr. The drain side columnar semiconductor layer 44b functions as a body of the drain side select transistor SDTr.

The source side gate insulating layer 43a is formed on a side wall of the source side hole 42a. The source side columnar semiconductor layer 44a is formed in a column shape so as to extend in the perpendicular direction with respect to the substrate 10 and so as to be in contact with the source side gate insulating layer 43a. The drain side gate insulating layer 43b is formed on a side wall of the drain side hole 42b. The drain side columnar semiconductor layer 44b is formed in a column shape so as to extend in the perpendicular direction with respect to the substrate 10 and so as to be in contact with the drain side gate insulating layer 43b.

The source side gate insulating layer 43a and the drain side gate insulating layer 43b are constituted by silicon oxide ($SiO_2$). The source side columnar semiconductor layer 44a and the drain side columnar semiconductor layer 44b are constituted by polysilicon (poly-Si).

Expressing the above-described configuration of the select transistor layer 40 in other words, the source side gate insulating layer 43a is formed so as to surround the source side columnar semiconductor layer 44a. The source side conductive layer 41a is formed so as to surround the source side gate insulating layer 43a and the source side columnar semiconductor layer 44a. The drain side gate insulating layer 43b is formed so as to surround the drain side columnar semiconductor layer 44b. The drain side conductive layer 41b is formed so as to surround the drain side gate insulating layer 43b and the drain side columnar semiconductor layer 44b.

The wiring layer 50 is formed on an upper layer of the select transistor layer 40, as shown in FIG. 4. The wiring layer 50 includes a source line layer 51, a plug layer 52, and a bit line layer 53. The source line layer 51 functions as the source line SL. The bit line layer 53 functions as the bit line BL.

The source line layer 51 is formed in a plate-like shape extending in the row direction. The source line layer 51 is formed so as to be in contact with upper surfaces of pairs of the source side columnar semiconductor layers 44a mutually adjacent in the column direction. The plug layer 52 is formed so as to extend in the perpendicular direction with respect to the substrate 10 and so as to be in contact with an upper surface of the drain side columnar semiconductor layer 44b. The bit line layer 53 is formed in stripes extending in the column direction and having a certain pitch in the row direction. The bit line layer 53 is formed so as to be in contact with an upper surface of the plug layer 52. The source line layer 51, the plug layer 52, and the bit line layer 53 are constituted by a metal such as tungsten (W).

Figure 5:
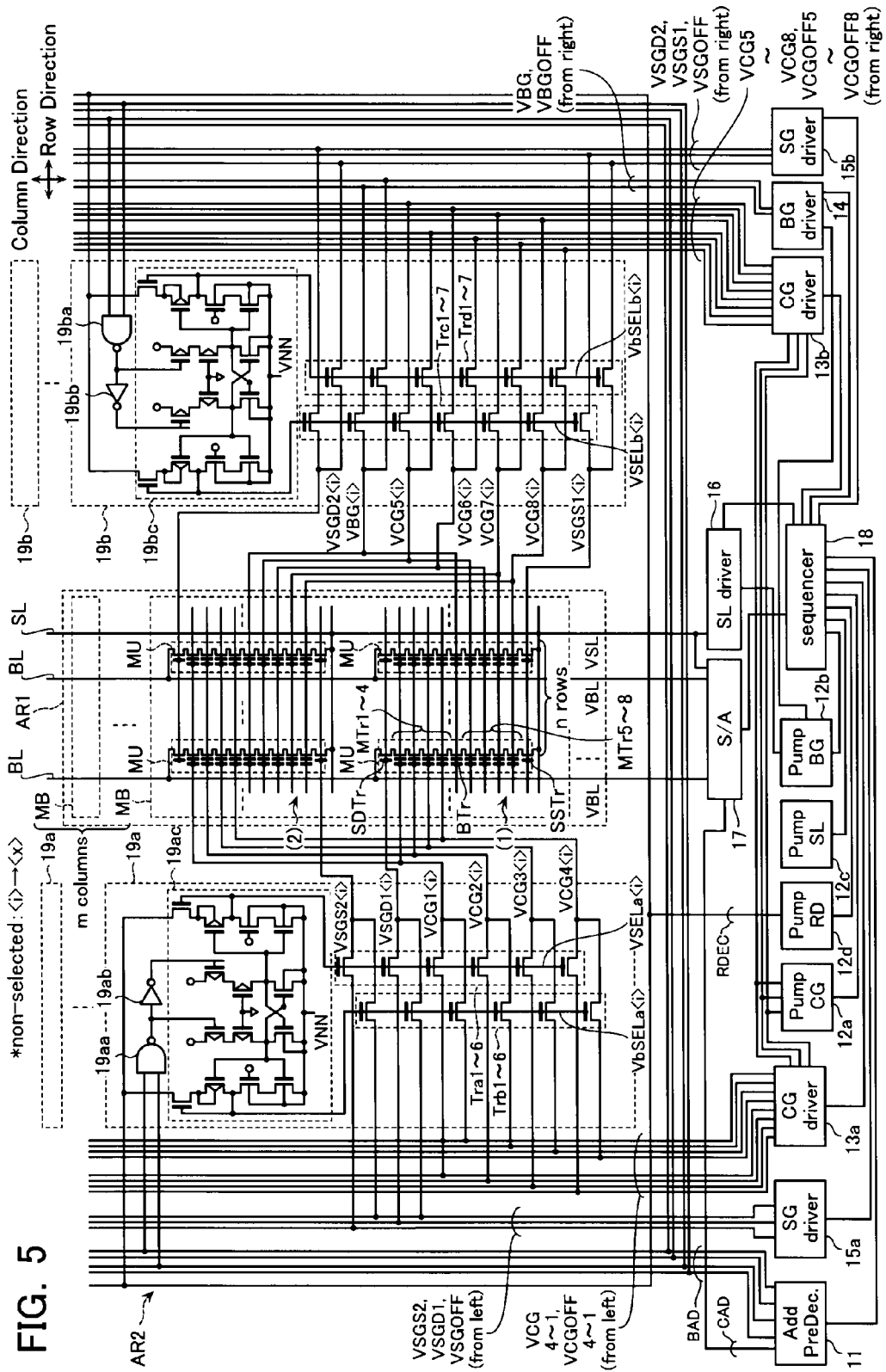
FIG. 5 is a circuit diagram showing a specific configuration of a control circuit AR2.

Next, a specific configuration of the control circuit AR2 is described with reference to FIG. 5. FIG. 5 is a circuit diagram showing the specific configuration of the control circuit AR2. As shown in FIG. 5, the control circuit AR2 includes an address decoder circuit 11, boost circuits 12a-12d, word line drive circuits 13a and 13b, a back gate line drive circuit 14, select gate line drive circuits 15a and 15b, a source line drive circuit 16, a sense amplifier circuit 17, a sequencer 18, and row decoder circuits 19a and 19b.

As shown in FIG. 5, the address decoder circuit 11 outputs a signal BAD to the row decoder circuits 19a and 19b, and outputs a signal CAD to the sense amplifier circuit 17. The signal BAD is for specifying a memory block MB (block address). The signal CAD is for specifying a column within the memory block MB (column address).

The boost circuits 12a-12d generate a boost voltage that has a voltage boosted from a power supply voltage. As shown in FIG. 5, the boost circuit 12a transfers the boost voltage to the word line drive circuits 13a and 13b. The boost circuit 12b transfers the boost voltage to the back gate line drive circuit 14. The boost circuit 12c outputs the boost voltage to the source line drive circuit 16. The boost circuit 12d outputs to the row decoder circuits 19a and 19b a signal RDEC which includes the boost voltage.

As shown in FIG. 5, the word line drive circuit 13a outputs signals VCG1-VCG4 and signals VCGOFF1-VCGOFF4. The word line drive circuit 13b outputs signals VCG5-VCG8 and signals VCGOFF5-VCGOFF8. The signals VCG1-VCG4 are used when driving the word lines WL1-WL4 in a selected memory block MB<i>, and the signals VCGOFF1-VCGOFF4 are used when driving the word lines WL1-WL4 in a non-selected memory block MB<x>. The signals VCG5-VCG8 are used when driving the word lines WL5-WL8 in the selected memory block MB<i>, and the signals VCGOFF5-VCGOFF8 are used when driving the word lines WL5-WL8 in the non-selected memory block MB<x>. Note that all the memory strings MS in the non-selected memory block MB<x> are non-selected memory strings MS.

As shown in FIG. 5, the back gate line drive circuit 14 outputs a signal VBG and a signal VBGOFF. The signal VBG is used when driving the back gate line BG in the selected memory block MB<i>, and the signal VBGOFF is used when driving the back gate line BG in the non-selected memory block MB<x>.

As shown in FIG. 5, the select gate line drive circuit 15a outputs a signal VSGS2, a signal VSGD1, and a signal VSGOFF. The select gate line drive circuit 15b outputs a signal VSGS1, a signal VSGD2, and the signal VSGOFF. The signal VSGS1 and the signal VSGS2 are used when driving the first-column source side select gate line SGS and the second-column source side select gate line SGS, respectively, in the selected memory block MB<i>. The signal VSGD1 and the signal VSGD2 are used when driving the first-column drain side select gate line SGD and the second-column drain side select gate line SGD, respectively, in the selected memory block MB<i>. The signal VSGOFF is used when driving the source side select gate line SGS and the drain side select gate line SGD in the non-selected memory block MB<x>.

As shown in FIG. 5, the source line drive circuit 16 outputs a signal VSL. The signal VSL is used when driving the source line SL.

As shown in FIG. 5, the sense amplifier circuit 17 outputs a signal VBL in accordance with the column address signal CAD, thereby charging a certain bit line BL to a certain potential, and then judges the held data of the memory transistor MTr in the memory string MS on the basis of a change in potential of the bit line BL. In addition, the sense amplifier circuit 17 outputs the signal VBL appropriate to a write data to a certain bit line BL in accordance with the column address CAD.

As shown in FIG. 5, the sequencer 18 supplies a control signal to the above-described circuits 11-17, thereby controlling the above-described circuits 11-17.

As shown in FIG. 5, the row decoder circuits 19a and 19b are provided one each to one of the memory blocks MB. The row decoder circuit 19a is provided to one end side in the row direction of the memory block MB. The row decoder circuit 19b is provided to the other end side in the row direction of the memory block MB.

The row decoder circuit 19a inputs signals VCG1<i>-VCG4<i> (or signals VCG1<x>-VCG4<x>) to gates of the memory transistors MTr1-MTr4, based on the signal BAD, the signals VCG1-VCG4, and the signals VCGOFF1-VCGOFF4. In addition, the row decoder circuit 19a selectively inputs a signal VSGS2<i> (or signal VSGS2<x>) to a gate of the source side select transistor SSTr in the second-column memory unit MU, based on the signal BAD, the signal VSGS2, and the signal VSGOFF. Furthermore, the row decoder circuit 19a selectively inputs a signal VSGD1<i> (or signal VSGD1<x>) to a gate of the drain side select transistor SDTr in the first-column memory unit MU, based on the signal BAD, the signal VSGD1, and the signal VSGOFF.

The row decoder circuit 19a includes a NAND circuit 19aa, a NOT circuit 19ab, a voltage conversion circuit 19ac, first transfer transistors Tra1-Tra6, and second transfer transistors Trb1-Trb6. The voltage conversion circuit 19ac generates a signal VSELa<i> (or VSELa<x>) based on the signal BAD which is received via the NAND circuit 19aa and the NOT circuit 19ab and on the signal RDEC, and outputs this signal VSELa<i> (or VSELa<x>) to gates of the first transfer transistors Tra1-Tra6. In addition, the voltage conversion circuit 19ac generates a signal VbSELa<i> (or VbSELa<x>) based on the signal BAD and on the signal RDEC, and outputs this signal VbSELa<i> (or VbSELa<x>) to gates of the second transfer transistors Trb1-Trb6.

The first transfer transistors Tra1-Tra4 are connected between the word line drive circuit 13a and the respective word lines WL1-WL4. The first transfer transistors Tra1-Tra4 output the signals VCG1<i>-VCG4<i> to the word lines WL1-WL4, based on the signals VCG1-VCG4 and VSELa<i>. The first transfer transistor Tra5 is connected between the select gate line drive circuit 15a and the source side select gate line SGS in the second-column memory unit MU. The first transfer transistor Tra5 outputs the signal VSGS2<i> to the source side select gate line SGS in the second-column memory unit MU, based on the signal VSGS2 and the signal VSELa<i>. The first transfer transistor Tra6 is connected between the select gate line drive circuit 15a and the drain side select gate line SGD in the first-column memory unit MU. The first transfer transistor Tra6 outputs the signal VSGD1<i> to the drain side select gate line SGD in the first-column memory unit MU, based on the signal VSGD1 and the signal VSELa<i>.

The second transfer transistors Trb1-Trb4 are connected between the word line drive circuit 13a and the respective word lines WL1-WL4. The second transfer transistors Trb1-Trb4 output the signals VCG1<x>-VCG4<x> to the word lines WL1-WL4, based on the signals VCGOFF1-VCGOFF4 and VbSELa<x>. The second transfer transistor Trb5 is connected between the select gate line drive circuit 15a and the source side select gate line SGS in the second-column memory unit MU. The second transfer transistor Trb5 outputs the signal VSGS2<x> to the source side select gate line SGS in the second-column memory unit MU, based on the signal VSGOFF and the signal VbSELa<x>. The second transfer transistor Trb6 is connected between the select gate line drive circuit 15a and the drain side select gate line SGD in the first-column memory unit MU. The second transfer transistor Trb6 outputs the signal VSGD1<x> to the drain side select gate line SGD in the first-column memory unit MU, based on the signal VSGOFF and the signal VbSELa<x>.

The row decoder circuit 19b inputs signals VCG5<i>-VCG8<i> (or signals VCG5<x>-VCG8<x>) to gates of the memory transistors MTr5-MTr8, based on the signal BAD, the signals VCG5-VCG8, and the signals VCGOFF5-VCGOFF8. In addition, the row decoder circuit 19b selectively inputs a signal VSGS1<i> (or signal VSGS1<x>) to a gate of the source side select transistor SSTr in the first-column memory unit MU, based on the signal BAD, the signal VSGS1, and the signal VSGOFF. Furthermore, the row decoder circuit 19a selectively inputs a signal VSGD2<i> (or signal VSGD2<x>) to a gate of the drain side select transistor SDTr in the second-column memory unit MU, based on the signal BAD, the signal VSGD2, and the signal VSGOFF.

The row decoder circuit 19b includes a NAND circuit 19ba, a NOT circuit 19bb, a voltage conversion circuit 19bc, first transfer transistors Trc1-Trc7, and second transfer transistors Trd1-Trd7. The voltage conversion circuit 19bc generates a signal VSELb<i> (or VSELb<x>) based on the signal BAD which is received via the NAND circuit 19ba and the NOT circuit 19bb and on the signal RDEC, and outputs this signal VSELb<i> (or VSELb<x>) to gates of the first transfer transistors Trc1-Trc7. In addition, the voltage conversion circuit 19bc generates a signal VbSELb<i> (or VbSELb<x>) based on the signal BAD and on the signal RDEC, and outputs this signal VbSELb<i> (or VbSELb<x>) to gates of the second transfer transistors Trd1-Trd7.

The first transfer transistors Trc1-Trc4 are connected between the word line drive circuit 13b and the respective word lines WL5-WL8. The first transfer transistors Trc1-Trc4 output the signals VCG5<i>-VCG8<i> to the word lines WL5-WL8, based on the signals VCG5-VCG8 and VSELb<i>. The first transfer transistor Trc5 is connected between the back gate line drive circuit 14 and the back gate line BG. The first transfer transistor Trc5 outputs the signal VBG to the back gate line BG, based on the signal VBG and the signal VSELb<i>. The first transfer transistor Trc6 is connected between the select gate line drive circuit 15b and the source side select gate line SGS in the first-column memory unit MU. The first transfer transistor Trc6 outputs the signal VSGS1<i> to the source side select gate line SGS in the first-column memory unit MU, based on the signal VSGS1 and the signal VSELb<i>. The first transfer transistor Trc7 is connected between the select gate line drive circuit 15b and the drain side select gate line SGD in the second-column memory unit MU. The first transfer transistor Trc7 outputs the signal VSGD2<i> to the drain side select gate line SGD in the second-column memory unit MU, based on the signal VSGD2 and the signal VSELb<i>.

The second transfer transistors Trd1-Trd4 are connected between the word line drive circuit 13b and the respective word lines WL5-WL8. The second transfer transistors Trd1-Trd4 output the signals VCG5<x>-VCG8<x> to the word lines WL5-WL8, based on the signals VCGOFF5-VCGOFF8 and VbSELb<x>. The second transfer transistor Trd5 is connected between the back gate line drive circuit 14 and the back gate line BG. The second transfer transistor Trd5 outputs the signal VBGOFF to the back gate line BG, based on the signal VBGOFF and the signal VbSELb<x>. The second transfer transistor Trd6 is connected between the select gate line drive circuit 15b and the source side select gate line SGS in the first-column memory unit MU. The second transfer transistor Trd6 outputs the signal VSGS1<x> to the source side select gate line SGS in the first-column memory unit MU, based on the signal VSGOFF and the signal VbSELb<x>. The second transfer transistor Trd7 is connected between the select gate line drive circuit 15b and the drain side select gate line SGD in the second-column memory unit MU. The second transfer transistor Trd7 outputs the signal VSGD2<x> to the drain side select gate line SGD in the second-column memory unit MU, based on the signal VSGOFF and the signal VbSELb<x>.

That is, connected to the word lines WL1-WL8 are, respectively, the first transfer transistors Tra1-Tra4 and Trc1-Trc4, and the second transfer transistors Trb1-Trb4 and Trd1-Trd4. Connected to the source side select gate line SGS and the drain side select gate line SGD are, respectively, the first transfer transistors Tra5 and Tra6 (Trc6 and Trc7), and the second transfer transistors Trb5 and Trb6 (Trd6 and Trd7). Connected to the back gate line BG are the first transfer transistor Trc5 and the second transfer transistor Trd5. Moreover, the first transfer transistors Tra1-Tra6 and Trc1-Trc7 are rendered conductive when the memory string MS is selected. The second transfer transistors Trb1-Trb6 and Trd1-Trd7 are rendered conductive when the memory string MS is non-selected. Note that a number of signal lines for supplying a signal to the word lines WL1-WL8 provided is greater than the number eight of the memory transistors MTr1-MTr8 in one of the memory strings MS, being, for example, sixteen.

Figure 6:
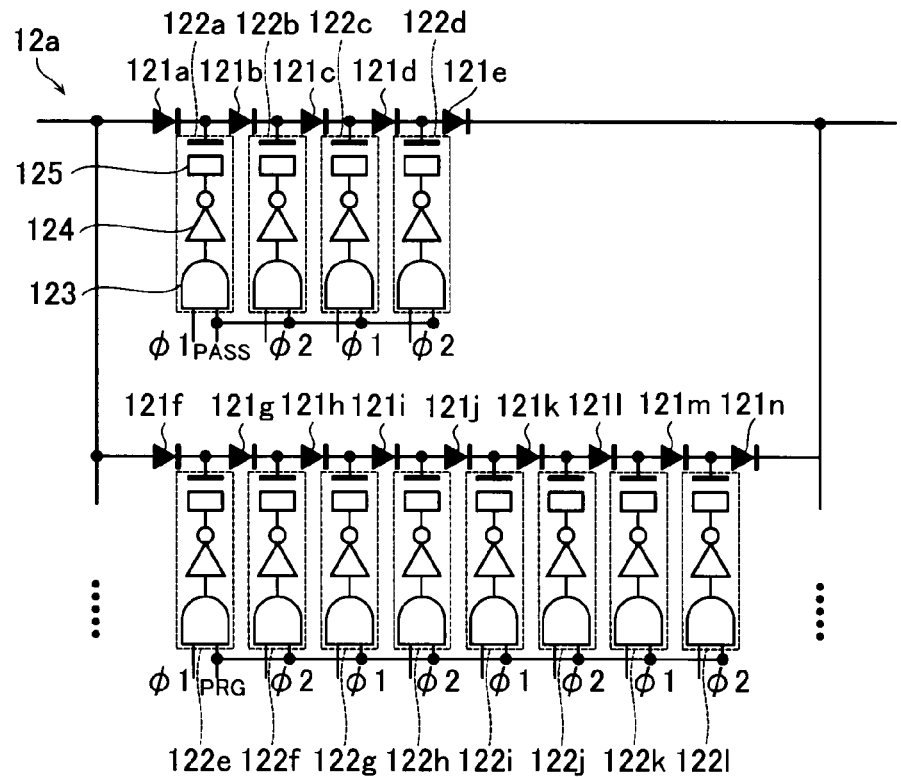

Next, a specific configuration of the boost circuits 12a-12d is described with reference to FIG. 6. FIG. 6 is a circuit diagram showing the boost circuit 12a. Note that the boost circuit 12a is mainly described below, since the configuration of the boost circuits 12b-12d is similar to that of the boost circuit 12a.

The boost circuit 12a utilizes charge/discharge of a capacitor to generate a voltage higher than a power-supply voltage Vdd. As shown in FIG. 6, the boost circuit 12a includes diodes 121a-121n and charge/discharge circuits 122a-122l. Note that the boost circuit 12a may include further diodes and charge/discharge circuits.

The diodes 121a-121e are connected in series, as shown in FIG. 6. Moreover, the diodes 121f-121n are connected in series. One end of the diode 121a is connected to one end of the diode 121f. One end of the diode 121e is connected to one end of the diode 121n.

As shown in FIG. 6, the charge/discharge circuits 122a-122d have an output terminal thereof connected between the diodes 121a-121e. The charge/discharge circuits 122e-122l have an output terminal thereof connected between the diodes 121f-121n. The charge/discharge circuits 122a-122l have an AND circuit 123, an inverter 124, and a capacitor 125 connected in series.

The charge/discharge circuits 122a-122d are configured to have one of input terminals of the AND circuit 123 thereof receiving, alternately, a signal φ1 or a signal φ2. The charge/discharge circuits 122a-122d are configured to have the other of the input terminals of the AND circuit 123 thereof receiving a signal PASS.

The charge/discharge circuits 122e-122l are configured to have one of input terminals of the AND circuit 123 thereof receiving, alternately, a signal φ1 or a signal φ2. The charge/discharge circuits 122e-122l are configured to have the other of the input terminals of the AND circuit 123 thereof receiving a signal PRG.

Figure 7A:
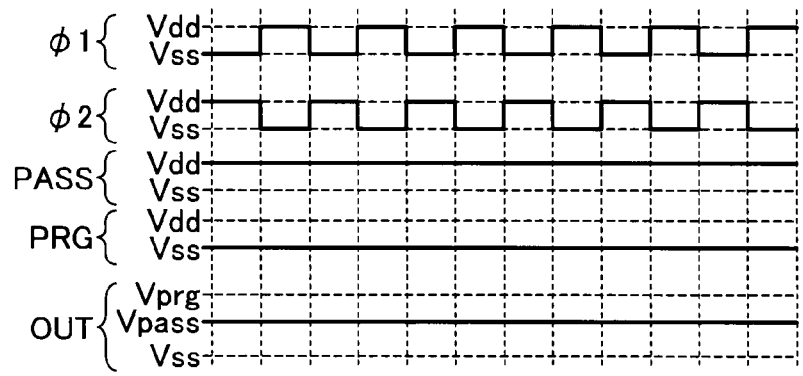
Figure 7B:
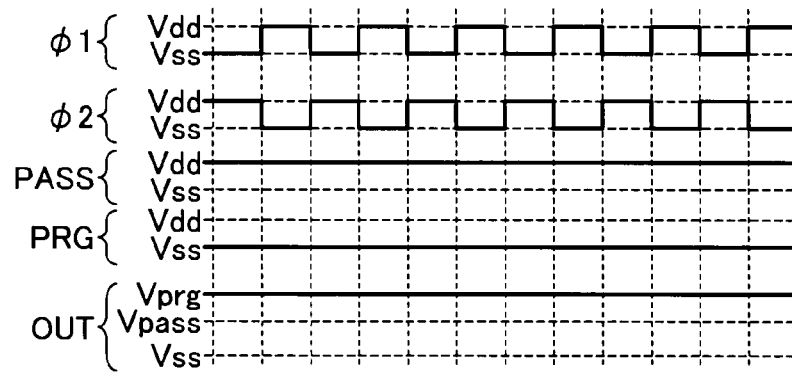

Here, operation of the boost circuit 12a is described with reference to FIGS. 7A and 7B. FIGS. 7A and 7B are timing charts showing operation of the boost circuit 12a. As shown in FIGS. 7A and 7B, the boost circuit 12a sets the signal PASS or the signal PRG to the power-supply voltage Vdd or the ground voltage Vss, according to a signal to be generated.

Figure 8:
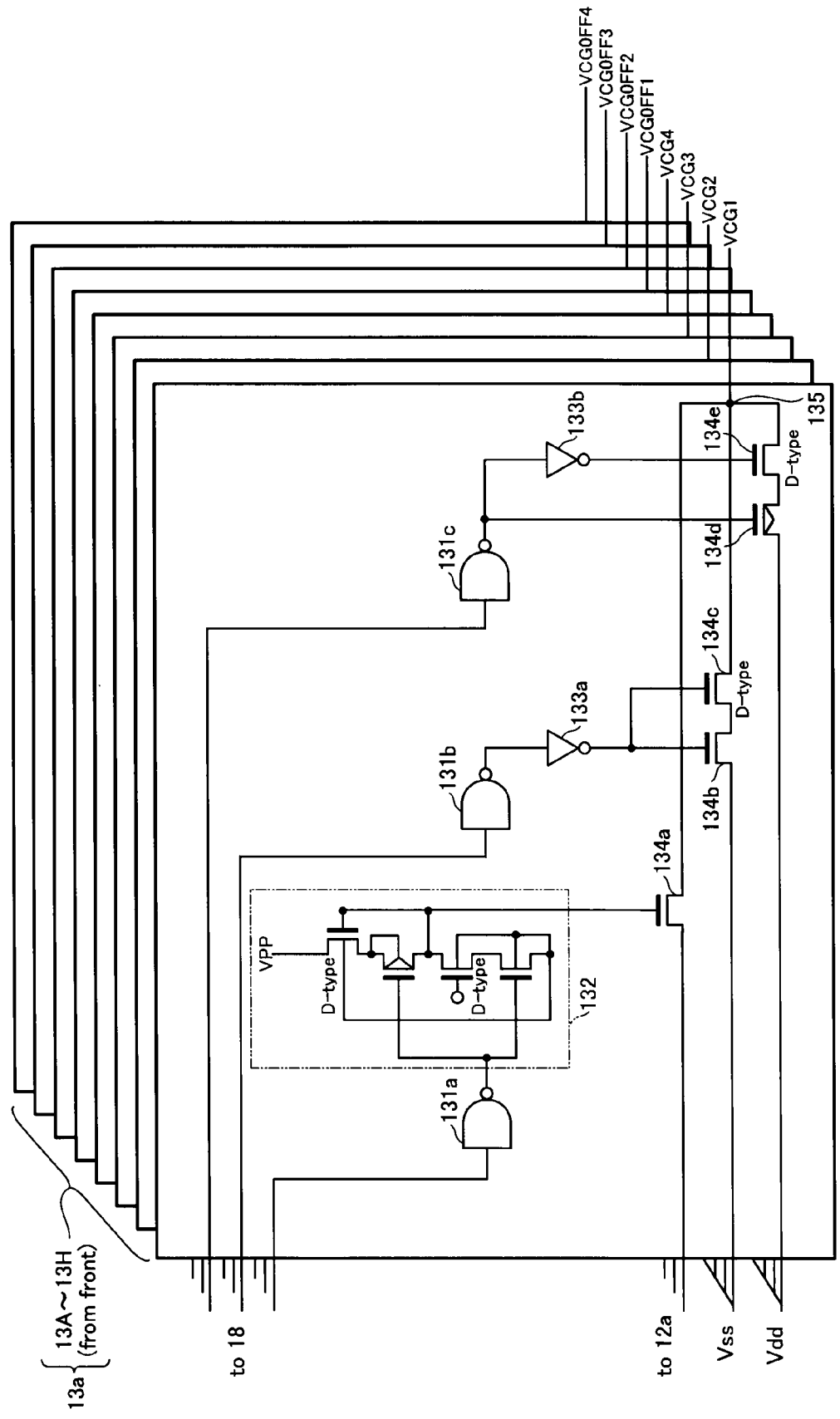

Next, a specific configuration of the word line drive circuits 13a and 13b is described with reference to FIG. 8. FIG. 8 is a circuit diagram showing the word line drive circuit 13a. Note that the word line drive circuit 13a is mainly described below, since the configuration of the word line drive circuit 13b is similar to that of the word line drive circuit 13a.

The word line drive circuit 13a is configured by first through eighth word line drive circuits 13A-13H, as shown in FIG. 8. The first through eighth word line drive circuits 13A-13H output the signals VCG1-VCG4 and VCGOFF1-VCGOFF4, respectively. Note that, in the word line drive circuit 13b, the first through eighth word line drive circuits 13A-13H output the signals VCG5-VCG8 and VCGOFF5-VCGOFF8, respectively (not shown).

The first word line drive circuit 13A includes NAND circuits 131a-131c, a voltage conversion circuit 132, NOT circuits 133a and 133b, and transfer transistors 134a-134e, as shown in FIG. 8. Input terminals of the NAND circuits 131a-131c receive a control signal from the sequencer 18. An output terminal of the NAND circuit 131a is connected via the voltage conversion circuit 132 to a gate of the transfer transistor 134a. An output terminal of the NAND circuit 131b is connected via the NOT circuit 133a to gates of the transfer transistors 134b and 134c. An output terminal of the NAND circuit 131c is connected to a gate of the transfer transistor 134d. In addition, the output terminal of the NAND circuit 131c is connected via the NOT circuit 133b to a gate of the transfer transistor 134e.

The transfer transistor 134a has one end thereof connected to an output terminal of the boost circuit 12a, and the other end thereof connected to a node 135. Here, the node 135 outputs the signal VCG1. The transfer transistor 134b is connected in series with the transfer transistor 134c. Another end of the transfer transistor 134b is connected to the ground voltage Vss. Another end of the transfer transistor 134c is connected to the node 135. The transfer transistor 134d is connected in series with the transfer transistor 134e. Another end of the transfer transistor 134*d* is connected to the power-supply voltage Vdd. Another end of the transfer transistor 134*e* is connected to the node 135. Note that the second through eighth word line drive circuits 13B-13H have a similar configuration to the first word line drive circuit 13A.

Figure 9:
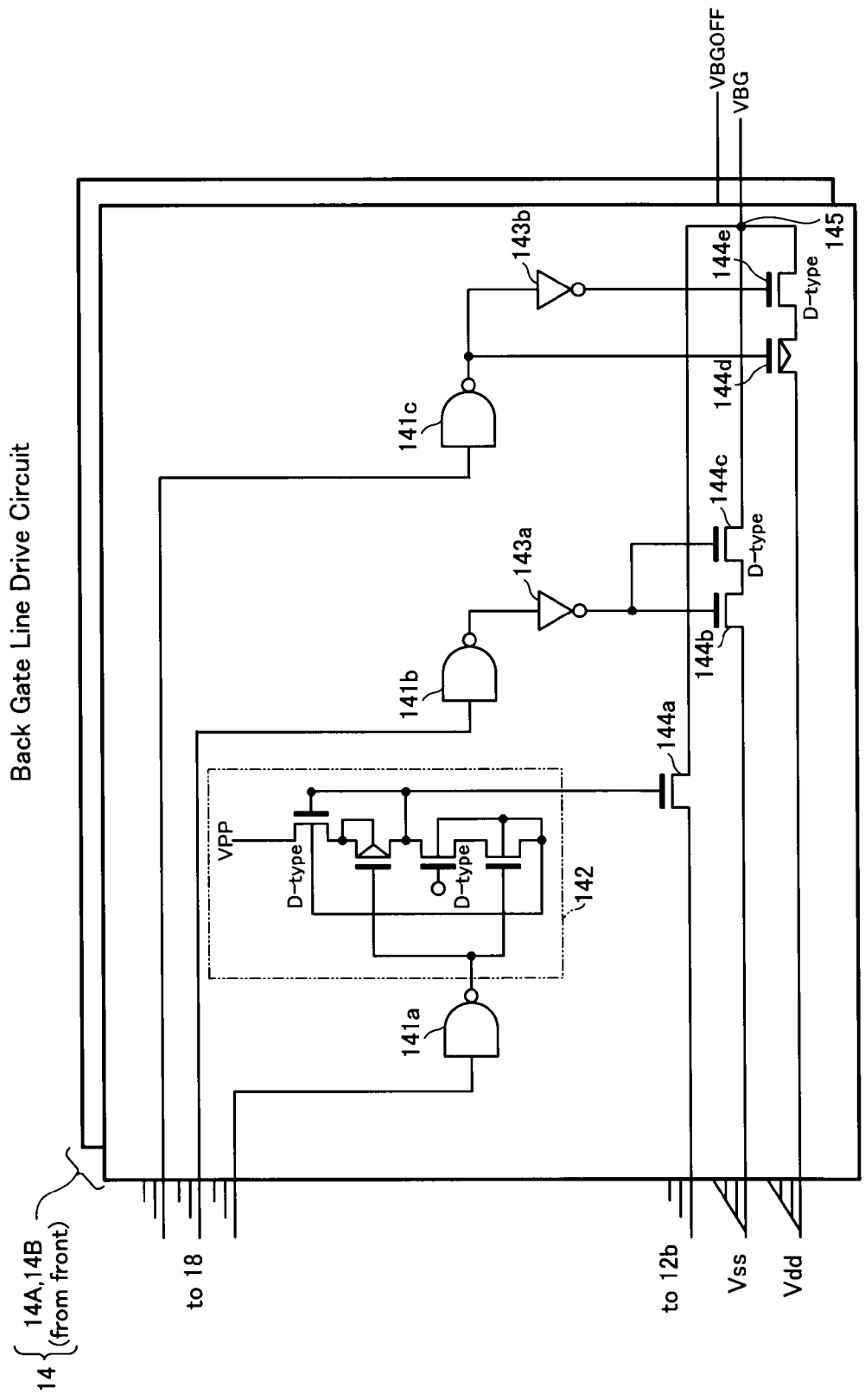
FIG. 9 is a circuit diagram showing a back gate line drive circuit 14.

Next, a specific configuration of the back gate line drive circuit 14 is described with reference to FIG. 9. FIG. 9 is a circuit diagram showing the back gate line drive circuit 14.

The back gate line drive circuit 14 is configured by first and second back gate line drive circuits 14A and 14B, as shown in FIG. 9. The first and second back gate line drive circuits 14A and 14B output the signals VBG and VBGOFF, respectively.

The first back gate line drive circuit 14A includes NAND circuits 141*a*-141*c*, a voltage conversion circuit 142, NOT circuits 143*a* and 143*b*, and transfer transistors 144*a*-144*e*, as shown in FIG. 9. These circuits 141*a*-141*c*, 142, and 143*a* and 143*b*, and transfer transistors 144*a*-144*e* have a connectional relationship substantially similar to that of the first word line drive circuit 13A, and a description thereof is thus omitted. Note that the transfer transistor 144*a* has one end thereof connected to the boost circuit 12*b*, and the other end thereof connected to anode 145. The node 145 outputs the signal VBG. The second back gate line drive circuit 14B has a similar configuration to the first back gate line drive circuit 14A.

Figure 10:
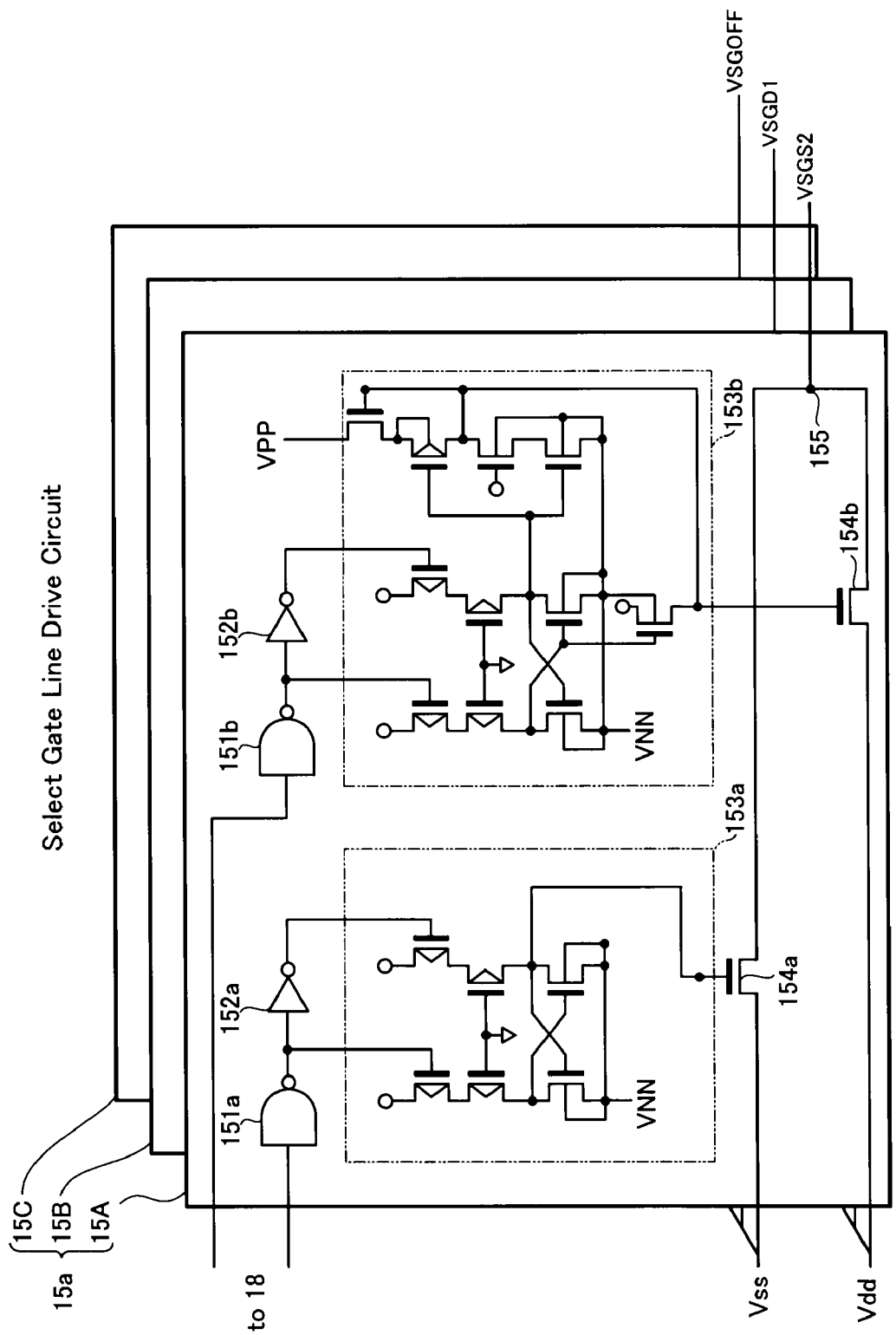

Next, a specific configuration of the select gate line drive circuits 15*a* and 15*b* is described with reference to FIG. 10. FIG. 10 is a circuit diagram showing the select gate line drive circuit 15*a*. Note that the select gate line drive circuit 15*a* is mainly described below, since the configuration of the select gate line drive circuit 15*b* is similar to that of the select gate line drive circuit 15*a*.

The select gate line drive circuit 15*a* is configured by first through third select gate line drive circuits 15A-15C, as shown in FIG. 10. The first through third select gate line drive circuits 15A-15C output the signals VSGS2, VSGD1, and VSGOFF, respectively. Note that, in the select gate line drive circuit 15*b*, the first through third select gate line drive circuits 15A-15C output the signals VSGS1, VSGD2, and VSGOFF, respectively (not shown).

The first select gate line drive circuit 15A includes NAND circuits 151*a* and 151*b*, NOT circuits 152*a* and 152*b*, voltage conversion circuits 153*a* and 153*b*, and transfer transistors 154*a* and 154*b*, as shown in FIG. 10. The NAND circuits 151*a* and 151*b* each receive a control signal from the sequencer 18. The NAND circuits 151*a* and 151*b* have an output terminal thereof connected to one of input terminals of the voltage conversion circuits 153*a* and 153*b*, respectively. In addition, the NAND circuits 151*a* and 151*b* have the output terminal thereof connected via the NOT circuits 152*a* and 152*b* to the other of the input terminals of the voltage conversion circuits 153*a* and 153*b*, respectively. The voltage conversion circuits 153*a* and 153*b* have an output terminal thereof connected to a gate of the transfer transistors 154*a* and 154*b*, respectively.

The transfer transistor 154*a* has one end thereof connected to the ground voltage Vss, and the other end thereof connected to a node 155. Here, the node 155 outputs the signal VSGS2. The transfer transistor 154*b* has one end thereof connected to the power-supply voltage Vdd, and the other end thereof connected to the node 155. Note that the second and third select gate line drive circuits 15B and 15C have a similar configuration to the first select gate line drive circuit 15A.

Figure 11:
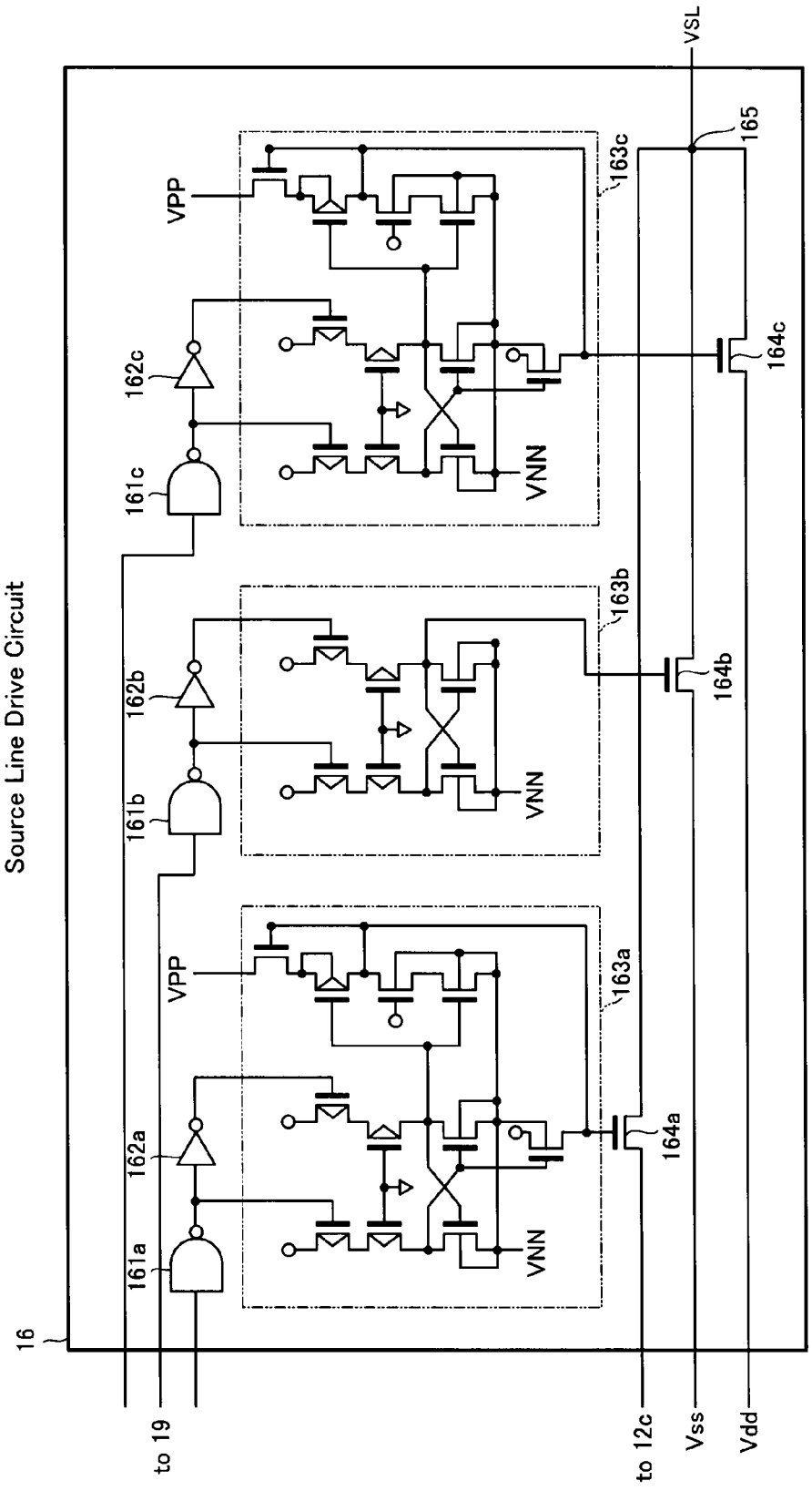
FIG. 11 is a circuit diagram showing a source line drive circuit 16.

Next, a specific configuration of the source line drive circuit 16 is described with reference to FIG. 11. FIG. 11 is a circuit diagram showing the source line drive circuit 16.

The source line drive circuit 16 includes NAND circuits 161*a*-161*c*, NOT circuits 162*a*-162*c*, voltage conversion circuits 163*a*-163*c*, and transfer transistors 164*a*-164*c*, as shown in FIG. 11. The NAND circuits 161*a*-161*c* each receive a control signal from the sequencer 18. The NAND circuits 161*a*-161*c* have an output terminal thereof connected to one of input terminals of the voltage conversion circuits 163*a*-163*c*, respectively. In addition, the NAND circuits 161*a*-161*c* have the output terminal thereof connected via the NOT circuits 162*a*-162*c* to the other of the input terminals of the voltage conversion circuits 163*a*-163*c*, respectively. The voltage conversion circuits 163*a*-163*c* have an output terminal thereof connected to a gate of the transfer transistors 164*a*-164*c*, respectively.

The transfer transistor 164*a* has one end thereof connected to an output terminal of the boost circuit 12*c*, and the other end thereof connected to a node 165. Here, the node 165 outputs the signal VSL. The transfer transistor 164*b* has one end thereof connected to the ground voltage Vss, and the other end thereof connected to the node 165. The transfer transistor 164*c* has one end thereof connected to the power-supply voltage Vdd, and the other end thereof connected to the node 165.

Figure 12:
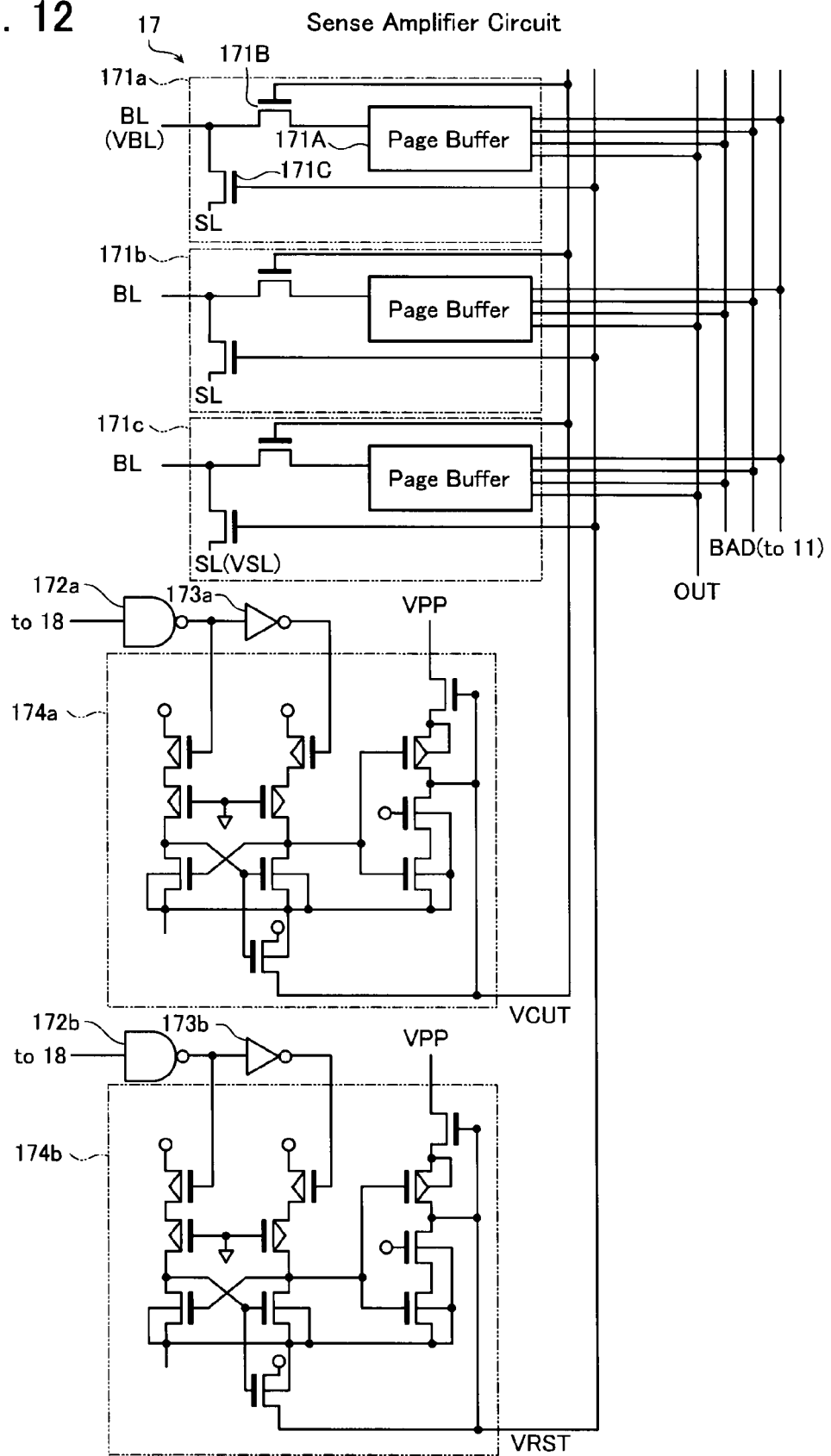
FIG. 12 is a circuit diagram showing a sense amplifier circuit 17.

Next, a specific configuration of the sense amplifier circuit 17 is described with reference to FIG. 12. FIG. 12 is a circuit diagram showing the sense amplifier circuit 17. As shown in FIG. 12, the sense amplifier circuit 17 includes select circuits 171*a*-171*c*, NAND circuits 172*a* and 172*b*, NOT circuits 173*a* and 173*b*, and voltage conversion circuits 174*a* and 174*b*. The select circuits 171*a*-171*c* selectively connect the bit line BL to the source line SL, and set a potential of the bit line BL to a same potential as the source line SL.

The select circuits 171*a*-171*c* each include a page buffer 171A and transistors 171B and 171C, as shown in FIG. 12. The page buffer 171A receives a signal from the bit line BL and outputs a signal based on the received signal to external and to the address decoder circuit 11. The transistor 171B has one end thereof connected to the bit line BL, and the other end thereof connected to the page buffer 171A. A gate of the transistor 171B receives an output signal VCUT from the voltage conversion circuit 174*a*. The transistor 171C has one end thereof connected to the bit line BL, and the other end thereof connected to the source line SL. A gate of the transistor 171C receives an output signal VRST from the voltage conversion circuit 174*b*.

The NAND circuits 172*a* and 172*b* each receive a control signal from the sequencer 18. The NAND circuits 172*a* and 172*b* have an output terminal thereof connected to one of input terminals of the voltage conversion circuits 174*a* and 174*b*, respectively. In addition, the NAND circuits 172*a* and 172*b* have the output terminal thereof connected via the NOT circuits 173*a* and 173*b* to the other of the input terminals of the voltage conversion circuits 174*a* and 174*b*, respectively. The voltage conversion circuit 174*a* inputs the signal VCUT to a gate of the transistor 171B on the basis of a signal received. The voltage conversion circuit 174*b* inputs the signal VRST to a gate of the transistor 171C on the basis of a signal received.

[Read Operation]

Figure 13:
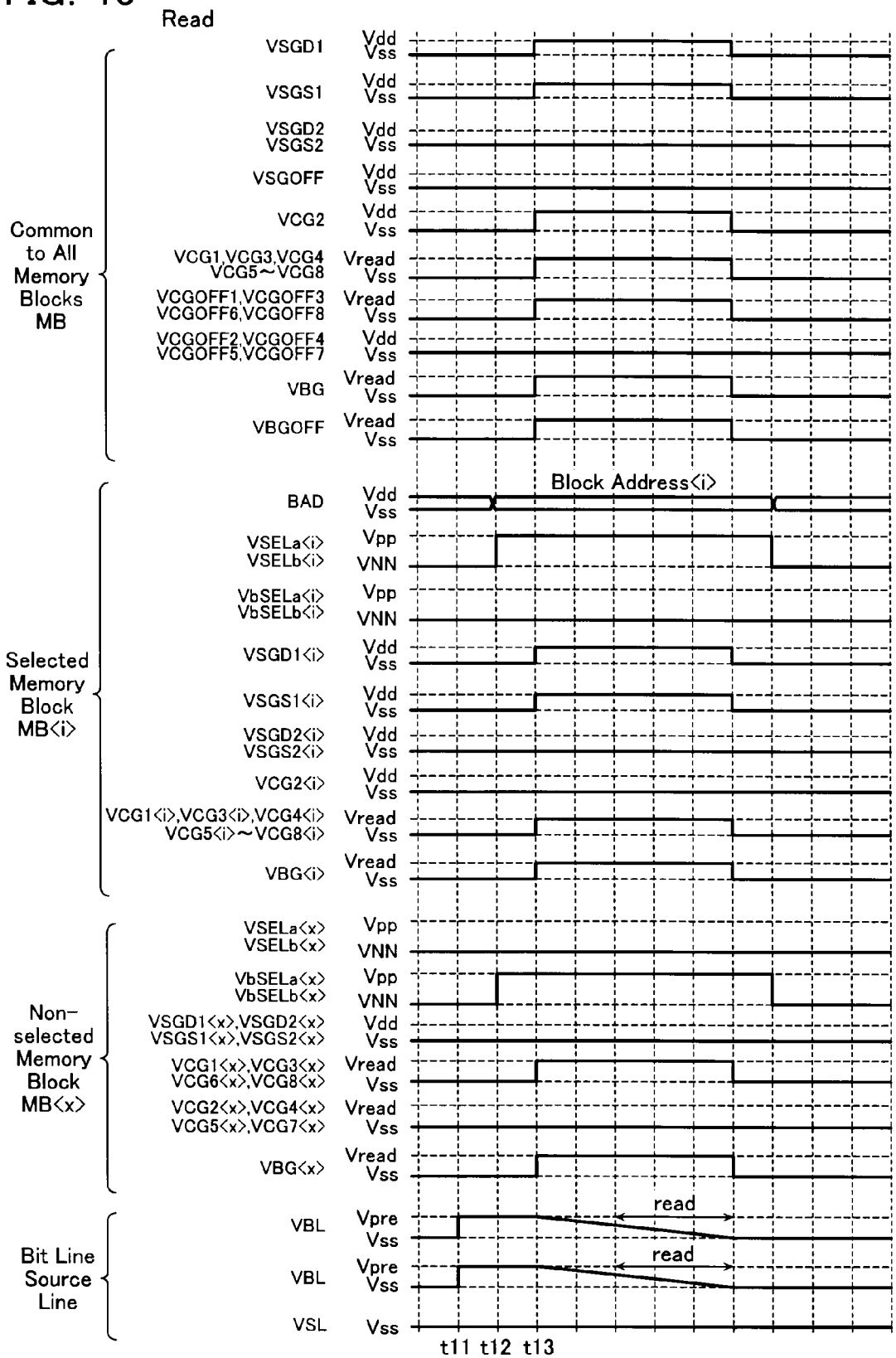
FIG. 13 is a timing chart showing a read operation in accordance with the first embodiment.

Next, a read operation in the nonvolatile semiconductor memory device in accordance with the first embodiment is described with reference to FIG. 13. FIG. 13 is a timing chart showing the read operation in accordance with the first embodiment. The read operation shown in FIG. 13 is executed on a selected memory transistor MTr2 included in selected memory transistors MTr of the first column in a selected memory block MB<i>. Note that all memory strings MS in a non-selected memory block MB<x> are non-selected memory strings MS.

First, operation in the selected memory block MB<i> is described with reference to FIG. 13. Initially, at time t11, the signal VBL rises to a voltage Vpre. That is, the bit line BL is pre-charged to the voltage Vpre. Then, at time t12, the signals VSELa<i> and VSELb<i> rise to a voltage Vpp. Next, at time t13, the signals VSGS1<i> and VSGD1<i> rise to the voltage Vdd. Additionally at time t13, the signals VCG1<i>, VCG3<i>-VCG8<i>, and VBG<i> rise to the read pass voltage Vread. Note that the voltage Vpp is a voltage for rendering the first transfer transistors Tra1-Tra4 and Trc1-Trc4 conductive.

Subsequent to time t13, a voltage variation in the bit line BL is detected by the sense amplifier circuit 15, thereby reading data in the selected memory transistor MTr2.

Next, operation in the non-selected memory block MB<x> is described with reference to FIG. 13. First, at time t11, the signal VBL rises to the voltage Vpre. Then, at time t12, the signals VbSELa<x> and VbSELb<x> rise to the voltage Vpp. Next, at time t13, the signals VCG1<x>, VCG3<x>, VCG6<x>, VCG8<x>, and VBG<x> rise to the read pass voltage Vread. Note that the signals VCG2<x>, VCG4<x>, VCG5<x>, and VCG7<x> are held at the voltage Vss.

Figure 14:
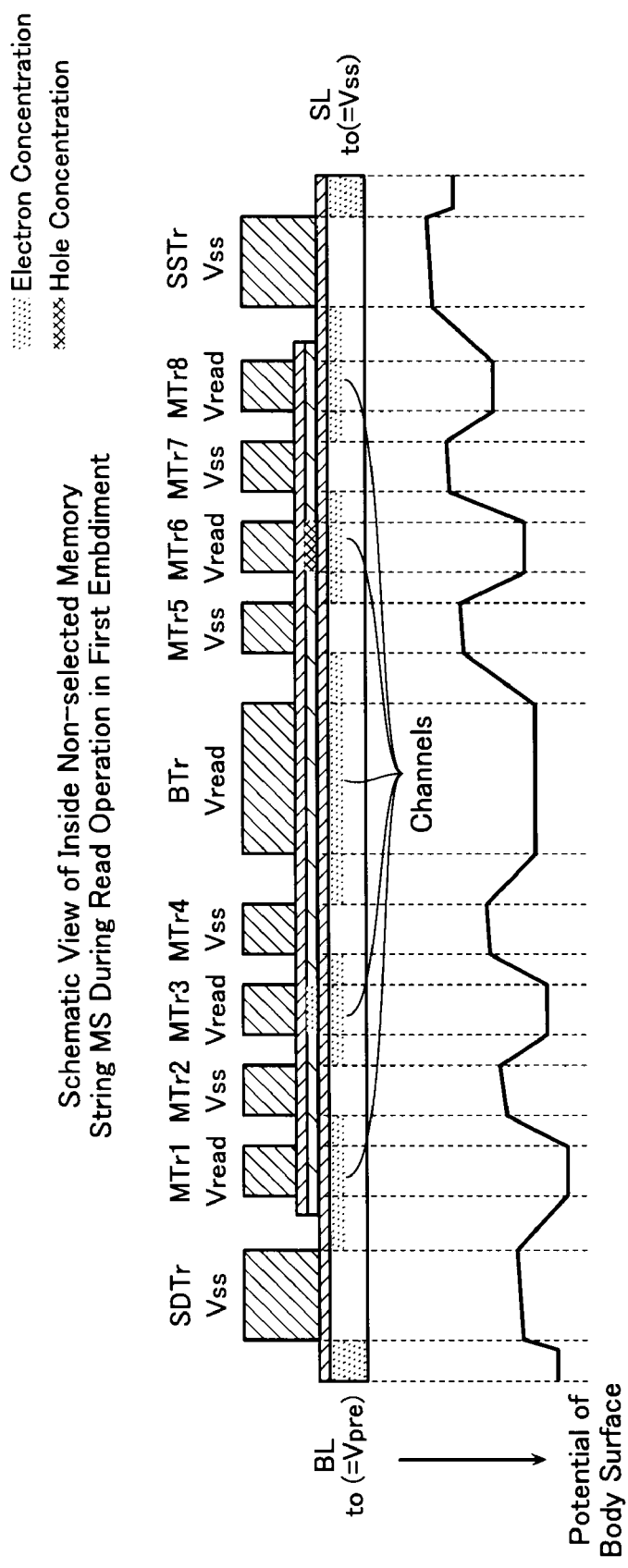
FIG. 14 is a schematic view of the read operation in accordance with the first embodiment.

An outline of the above-described read operation in the non-selected memory block MB<x> is now described with reference to FIG. 14. In FIG. 14, the memory transistor MTr3 is assumed to be in a write state (electrons are stored in the charge storage layer and a threshold voltage of the memory transistor has a positive value), and the memory transistor MTr6 is assumed to be in an over-erased state (due to an excessive erase operation, a threshold voltage of the memory transistor has an excessively large negative value). That is, the charge storage layer in the memory transistor MTr3 is assumed to have a high concentration of electrons, and the charge storage layer in the memory transistor layer MTr6 is assumed to have a high concentration of holes.

If the operation shown in FIG. 13 is executed, there is no channel formed in bodies of the source side select transistor SSTr, the drain side select transistor SDTr, and the memory transistors MTr2, MTr4, MTr5, and MTr7 in the non-selected memory block MB<x>, as shown in FIG. 14. On the other hand, there is a channel formed in bodies of the memory transistors MTr1, MTr3, MTr6, and MTr8, and the back gate transistor BTr.

That is, during the read operation in the nonvolatile semiconductor memory device in accordance with the first embodiment, gates of the memory transistors MTr1-MTr8 and the back gate transistor BTr in the non-selected memory string MS are applied, alternately, with the read pass voltage Vread and the voltage Vss, thereby making a potential of the bodies of the memory transistors MTr1, MTr3, MTr6, and MTr8, and the back gate transistor BTr lower than a potential of the bodies of the other memory transistors MTr2, MTr4, MTr5, and MTr7, and the source side select transistor SSTr. Since the memory transistors are applied with the voltage Vread, the channel is formed in the bodies of the memory transistors irrespective of whether the memory transistors are in the write state (MTr3) or the over-erased state (MTr6).

The above-described read operation causes an energy barrier to be formed between the bodies of the source side select transistor SSTr and the source line SL, and causes an energy barrier to be formed between the bodies of the drain side select transistor SDTr and the bit line BL. These energy barriers enable curbing of a current flowing from the bit line BL to the source line SL via the non-selected memory string MS during the read operation.

Furthermore, a well-type potential is formed in the bodies of the memory transistors MTr1, MTr3, MTr6, and MTr8, and the back gate transistor BTr. Electrons are trapped in the well-type potential, whereby the current flowing from the bit line BL to the source line SL via the non-selected memory string MS during the read operation can be curbed.

[Write Operation]

Figure 15:
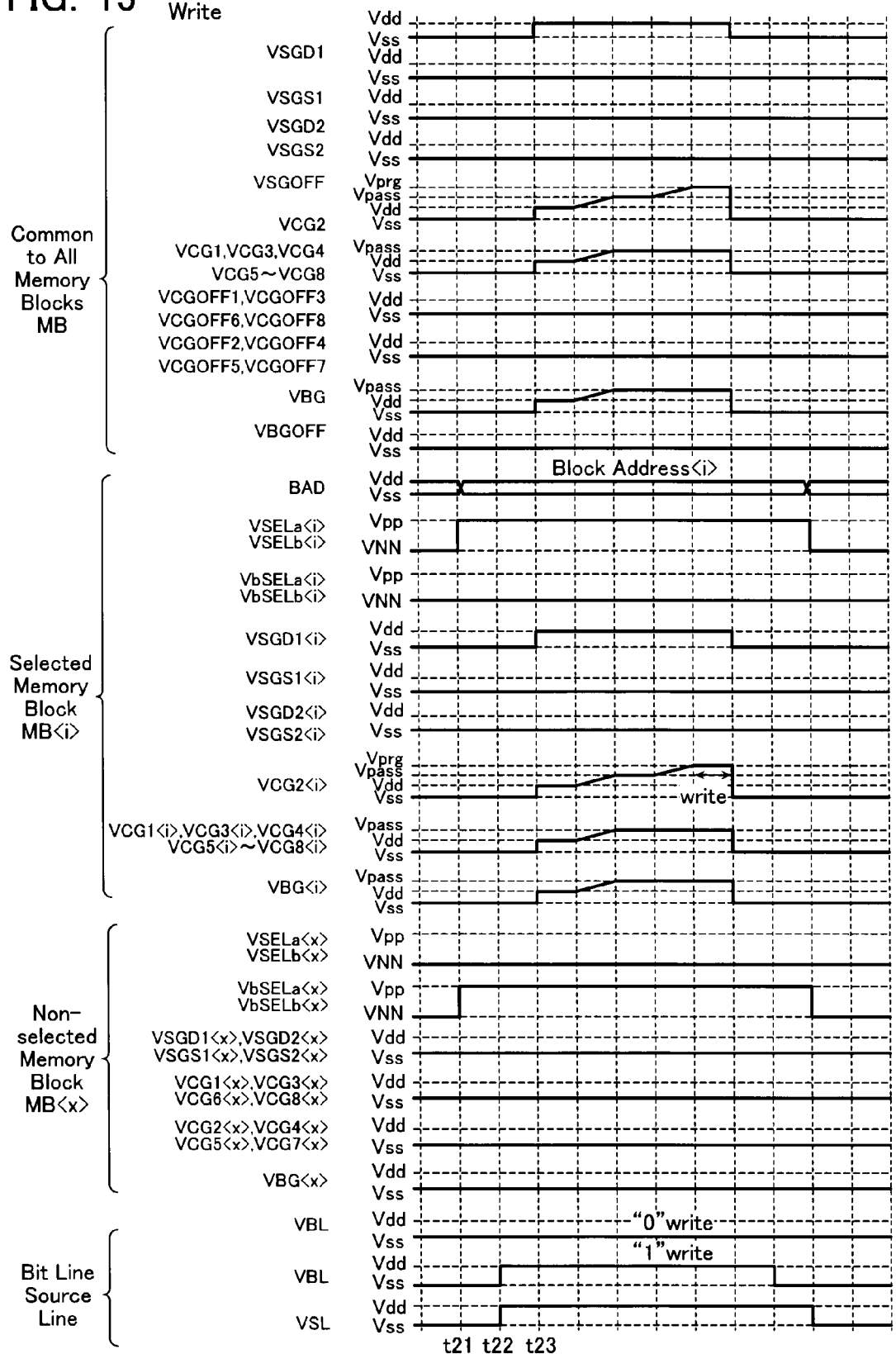
FIG. 15 is a timing chart showing a write operation in accordance with the first embodiment.

Next, a write operation in the nonvolatile semiconductor memory device in accordance with the first embodiment is described with reference to FIG. 15. FIG. 15 is a timing chart showing the write operation in accordance with the first embodiment. The write operation shown in FIG. 15 is executed on a selected memory transistor MTr2 included in selected memory transistors MTr of the first column in a selected memory block MB<i>.

First, at time t21, the signals VSELa<i> and VSELb<i> rise to the voltage Vpp. Then, at time t22, the signal VSL rises to the voltage Vdd. Additionally at time t22, the signal VBL rises to the voltage Vdd in the case that a "1" write is performed, and is held at the voltage Vss in the case that a "0" write is performed. Next, at time t23, the signal VSGD1<i> rises to the voltage Vdd. Additionally at time t23, the signal VCG2<i> rises to the voltage Vprg, and the signals VCG1<i>, VCG3<i>-VCG8<i>, and VBG<i> rise to the voltage Vpass. Note that the voltage Vpass is a voltage for rendering the memory transistor MTr conductive, and the voltage Vprg is a voltage for causing a charge to be stored in the charge storage layer of the memory transistor MTr.

Subsequent to time t23, a gate of the selected memory transistor MTr2 is applied with a certain voltage, whereby the write operation is executed.

[Erase Operation]

Figure 16:
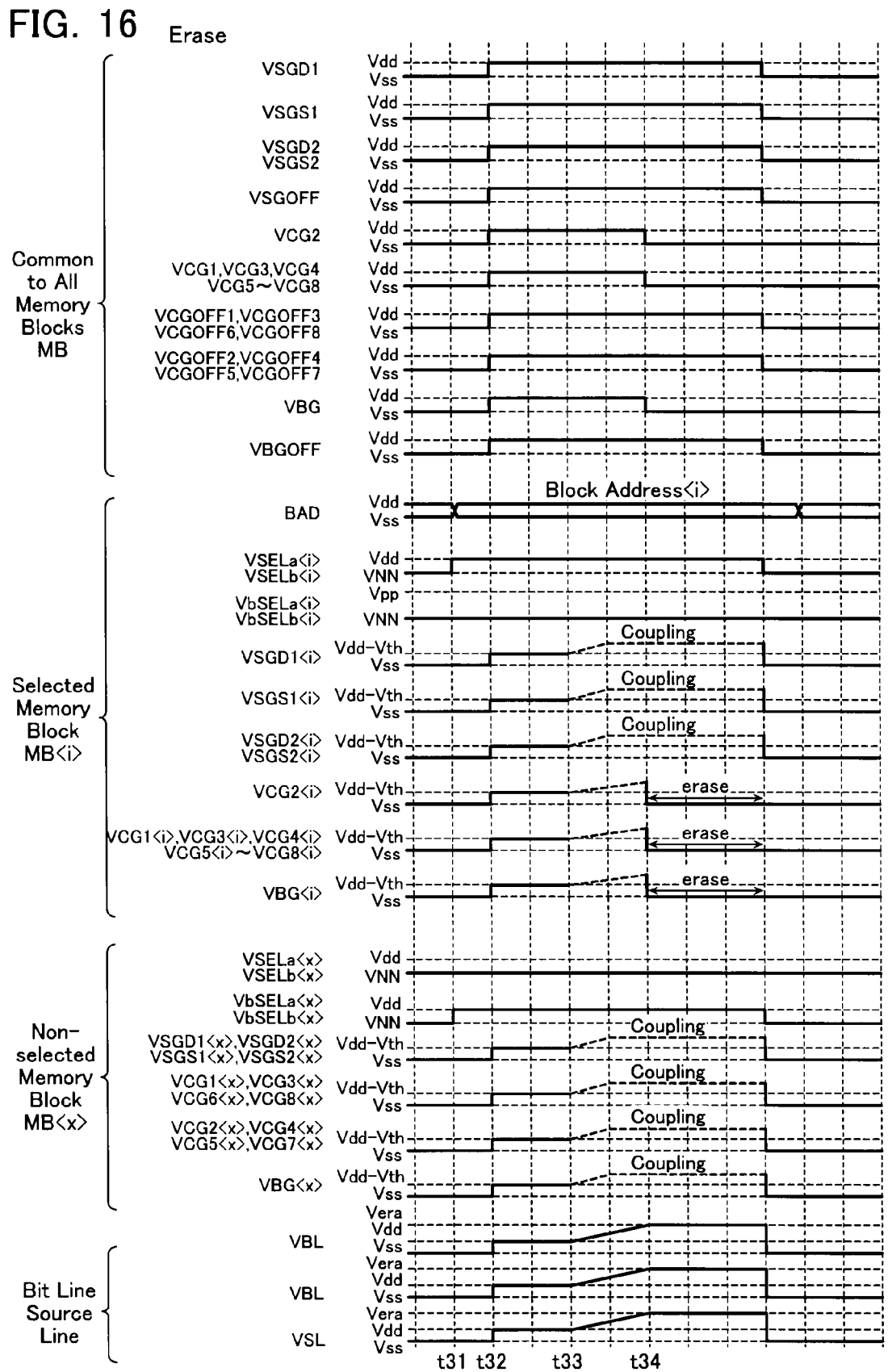
FIG. 16 is a timing chart showing an erase operation in accordance with the first embodiment.

Next, an erase operation in the nonvolatile semiconductor memory device in accordance with the first embodiment is described with reference to FIG. 16. FIG. 16 is a timing chart showing the erase operation in accordance with the first embodiment. The erase operation shown in FIG. 16 is executed on memory transistors MTr1-MTr8 in an entirety of a selected memory block MB<i>.

First, at time t31, the signals VSELa<i> and VSELb<i> rise to the voltage Vdd. Then, at time t32, the signals VSGS1<i>, VSGS2<i>, VSGD1<i>, VSGD2<i>, VCG1<i>-VCG8<i>, and VBG<i> rise to a voltage Vdd-Vth. Next, at time t33, the signals VSL and VBL rise to a voltage Vera. Additionally at time t33, the signals VSGS1<i>, VSGS2<i>, VSGD1<i>, VSGD2<i>, VCG1<i>-VCG8<i>, and VBG<i> are set to a floating state and subsequently boosted by coupling. Then, at time t34, the signals VCG1<i>-VCG8<i> and VBG<i> are lowered to the voltage Vss. Note that the voltage Vera is a voltage to cause generation of a GIDL current.

Subsequent to time t34, holes caused by the GIDL current are injected into the charge storage layer of the memory transistors MTr1-MTr8, whereby the erase operation is executed.

[Advantages]

Next, advantages of the first embodiment are described. As shown in the above-described FIG. 14, during the read operation in the nonvolatile semiconductor memory device in accordance with the first embodiment, the well-type potential is formed in the bodies of the memory transistors MTr1, MTr3, MTr6, and MTr8, and the back gate transistor BTr included in the non-selected memory string MS. Consequently, during the read operation in the nonvolatile semiconductor memory device in accordance with the first embodiment, the current flowing from the bit line BL to the source line SL via the non-selected memory string MS can be curbed.

Second Embodiment

Configuration

Next, a nonvolatile semiconductor memory device in accordance with a second embodiment is described. A configuration of the nonvolatile semiconductor memory device in accordance with the second embodiment is similar to that of the first embodiment and a description thereof is thus omitted. Note that in the second embodiment, identical symbols are assigned to configurations similar to those in the first embodiment and descriptions thereof are omitted.

During a read operation in the nonvolatile semiconductor memory device in accordance with the second embodiment, the power-supply voltage Vdd is applied to gates of mutually adjacent memory transistors MTr included in a non-selected memory string MS (for example, MTr2 and MTr3, and/or MTr5 and MTr6), thereby making a potential of the body between the adjacent memory transistors MTr lower than a potential of the bodies of other memory transistors MTr that have the ground voltage Vss applied to a gate thereof. The power-supply voltage Vdd is a positive voltage smaller than the read pass voltage Vread.

[Read Operation]

Figure 17:
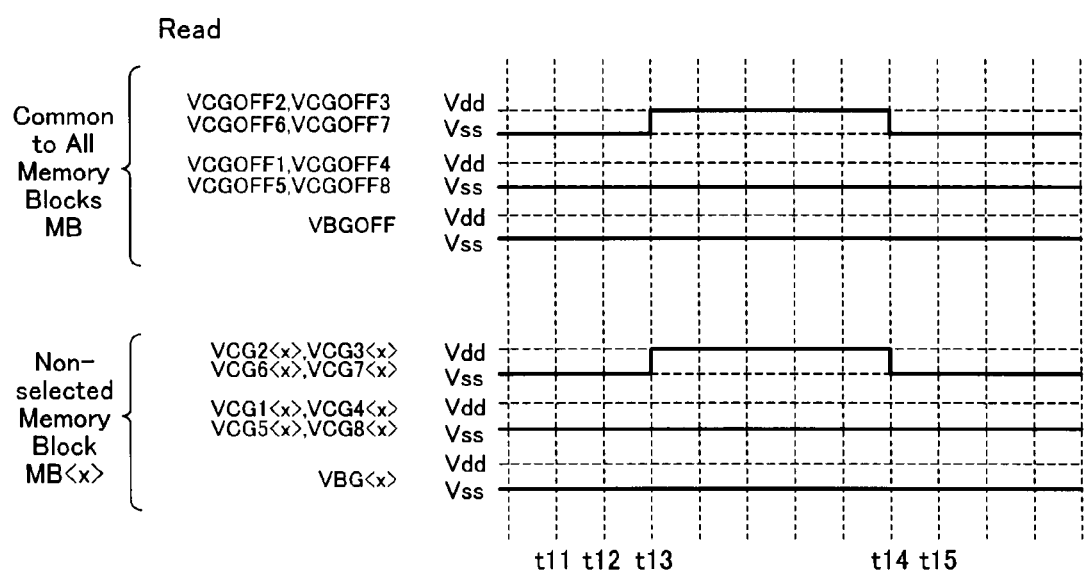
FIG. 17 is a timing chart showing a read operation in accordance with a second embodiment.

Next, a read operation in the nonvolatile semiconductor memory device in accordance with the second embodiment is described with reference to FIG. 17. FIG. 17 is a timing chart showing the read operation in accordance with the second embodiment. In the read operation of the second embodiment, only operation in the non-selected memory block MB<x> differs from that of the first embodiment.

The read operation in the non-selected memory block MB<x> differs from that of the first embodiment in that, at time t13, the signals VCG2<x>, VCG3<x>, VCG6<x>, and VCG7<x> rise to the power-supply voltage Vdd. Note that the signals VCG1<x>, VCG4<x>, VCG5<x>, VCG8<x>, and VBG<x> are held at the ground voltage Vss. The other signals are driven similarly to the first embodiment.

Figure 18:
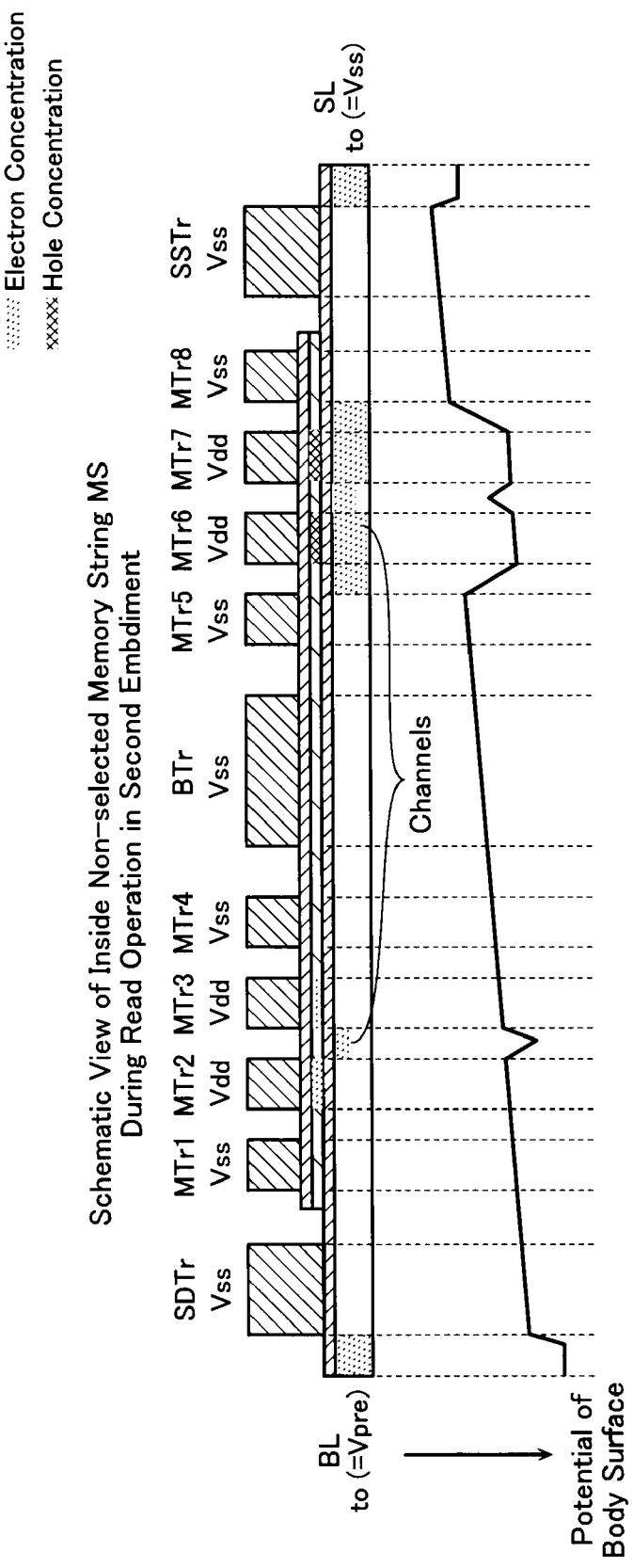
FIG. 18 is a schematic view of the read operation in accordance with the second embodiment.

An outline of the above-described read operation in the non-selected memory block MB<x> is now described with reference to FIG. 18. In FIG. 18, the memory transistors MTr2 and MTr3 are assumed to be in a write state, and the memory transistors MTr6 and MTr7 are assumed to be in an over-erased state.

If the operation shown in FIG. 17 is executed, there is no channel formed in bodies of the source side select transistor SSTr, the drain side select transistor, SDTr, the memory transistors MTr1-MTr4, MTr5, and MTr8, and the back gate transistor BTr in the non-selected memory block MB<x>, as shown in FIG. 18. On the other hand, although there is no channel formed in the bodies of the memory transistors MTr2 and MTr3 which are continuously applied with the power-supply voltage Vdd, there is a channel formed between the two transistors MTr2 and MTr3 due to a fringe electric field of the voltage Vdd, irrespective of stored data in the memory transistors MTr2 and MTr3. In addition, a potential well of small width is formed in a body between the memory transistors MTr2 and MTr3.

Moreover, since the memory transistors MTr6 and MTr7 are in the over-erased state, a continuous extended channel is formed in bodies thereof. As a result, a potential of the body directly below the memory transistors MTr6 and MTr7 is lowered overall (a potential well of large width is formed) compared to a potential of bodies of the memory transistors MTr5 and MTr8 (applied with the voltage Vss).

That is, during the read operation in the nonvolatile semiconductor memory device in accordance with the second embodiment, the voltage Vdd is applied to gates of the mutually adjacent memory transistors MTr2 and MTr3, and the mutually adjacent memory transistors MTr6 and MTr7 in the non-selected memory string MS, thereby making the potential of the body between the memory transistors MTr2 and MTr3, and the potential of the body between the memory transistors MTr6 and MTr7 lower than the potential of the bodies of other memory transistors MTr.

[Advantages]

Next, advantages of the second embodiment are described. As shown in FIG. 18, in the non-selected memory block MB<x>, an energy barrier is formed between the source side select transistor SSTr and the source line SL, and between the drain side select transistor SDTr and the bit line BL. These energy barriers enable curbing of a current flowing from the bit line BL to the source line SL via the non-selected memory string MS during the read operation in the nonvolatile semiconductor memory device in accordance with the second embodiment.

Furthermore, in the non-selected memory block MB<x>, a well-type potential is formed in the body between the memory transistors MTr2 and MTr3. In addition, a continuous extended well-type potential is formed in the bodies of the memory transistors MTr6 and MTr7. Electrons are trapped in these well-type potentials, whereby the current flowing from the bit line BL to the source line SL via the non-selected memory string MS during the read operation in the nonvolatile semiconductor memory device in accordance with the second embodiment can be curbed.

Third Embodiment

Configuration

Figure 19:
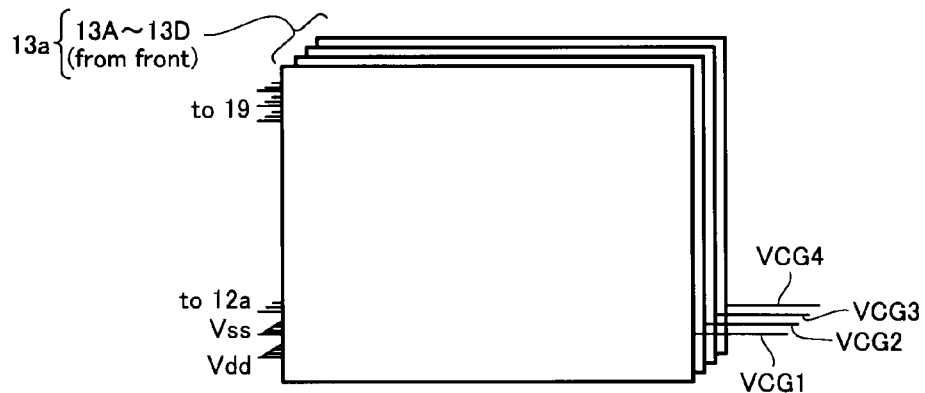
FIG. 19 is a block diagram showing a word line drive circuit 13a in accordance with a third embodiment.
Figure 20:
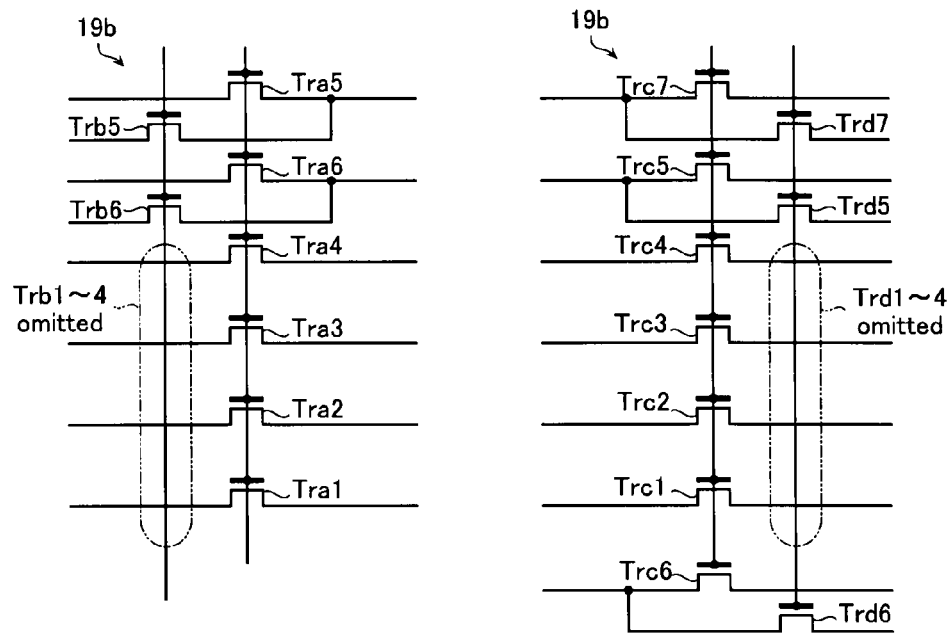
FIG. 20 is a partial circuit diagram showing row decoder circuits 19a and 19b in accordance with the third embodiment.

Next, a configuration of a nonvolatile semiconductor memory device in accordance with a third embodiment is described with reference to FIGS. 19 and 20. FIG. 19 is a block diagram showing a word line drive circuit 13a in accordance with the third embodiment. FIG. 20 is a partial circuit diagram showing row decoder circuits 19a and 19b in accordance with the third embodiment. Note that in the third embodiment, identical symbols are assigned to configurations similar to those in the first and second embodiments and descriptions thereof are omitted.

During a read operation in the nonvolatile semiconductor memory device in accordance with the third embodiment, the power-supply voltage Vdd is applied only to a gate of the back gate transistor BTr included in a non-selected memory string MS, thereby making only a potential of the body of the back gate transistor BTr lower than that of the others. To realize such a configuration, the nonvolatile semiconductor memory device in accordance with the third embodiment includes word line drive circuits 13a and 13b, and row decoder circuits 19a and 19b which differ from those of the first embodiment.

There is no need for the word line drive circuits 13a and 13b to drive the word lines WL1-WL8 included in the non-selected memory block MB<x> during the read operation. Consequently, the word line drive circuit 13a differs from the first embodiment in including only the first through fourth word line drive circuits 13A-13D and outputting only the signals VCG1-VCG4, as shown in FIG. 19. Note that the word line drive circuit 13b has a similar configuration to the word line drive circuit 13a.

The row decoder circuit 19a has a configuration omitting the second transfer transistors Trb1-Trb4 for similar reasons to those of the word line drive circuits 13a and 13b described above, as shown in FIG. 20. The row decoder circuit 19b similarly has a configuration omitting the second transfer transistors Trd1-Trd4.

[Read Operation]

Figure 21:
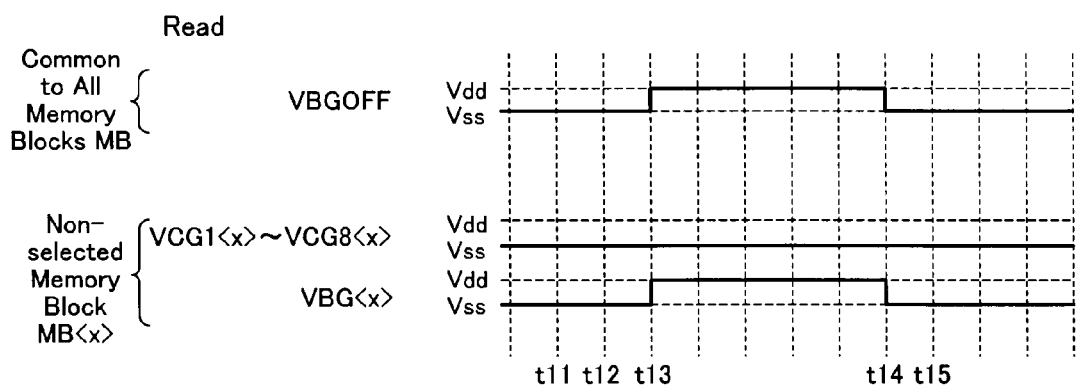
FIG. 21 is a timing chart showing a read operation in accordance with the third embodiment.

Next, a read operation in the nonvolatile semiconductor memory device in accordance with the third embodiment is described with reference to FIG. 21. FIG. 21 is a timing chart showing the read operation in accordance with the third embodiment. In the read operation of the third embodiment, only operation in the non-selected memory block MB<x> differs from that of the first embodiment.

Operation in the non-selected memory block MB<x> differs from that of the first and second embodiments in that, at time t13, only the signal VBG<x> rises to the power-supply voltage Vdd. Note that the signals VCG1<x>-VCG8<x> are held at the ground voltage Vss. The other signals are driven similarly to the first embodiment.

Figure 22:
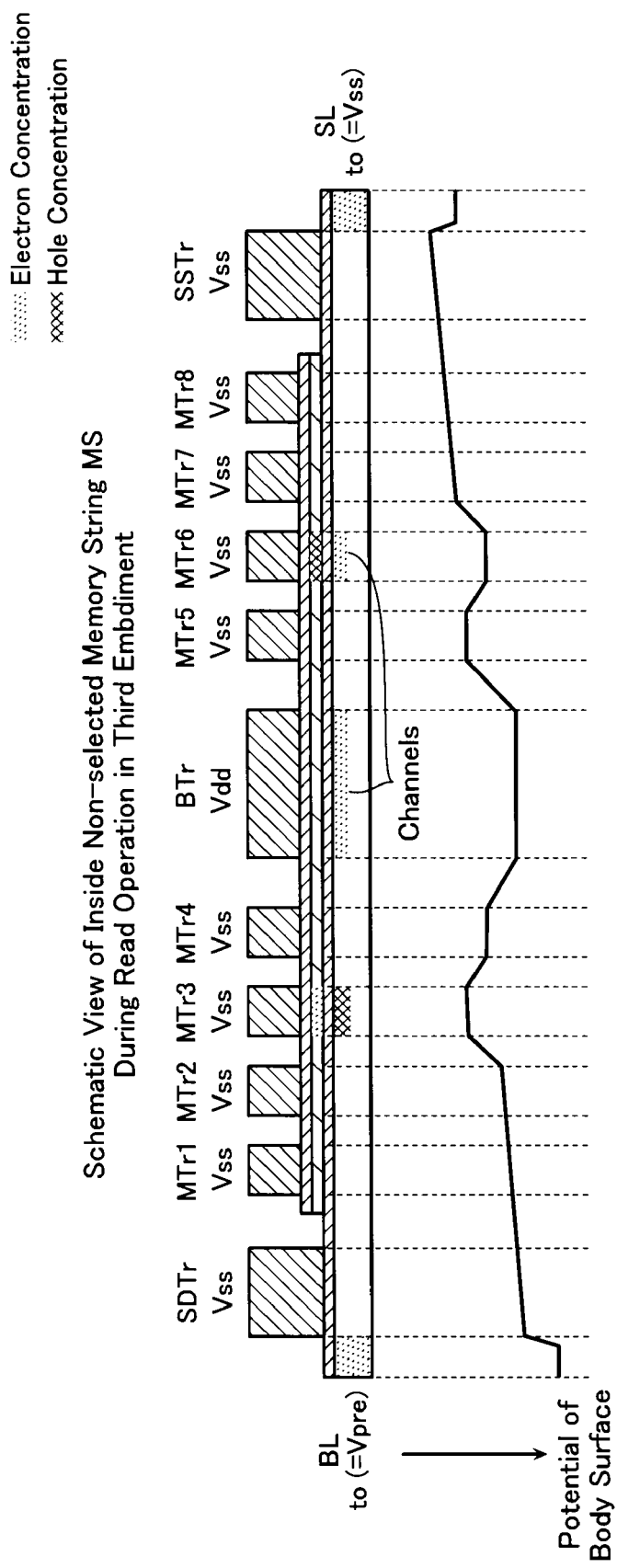
FIG. 22 is a schematic view of the read operation in accordance with the third embodiment.

An outline of the above-described read operation in the non-selected memory block MB<x> is now described with reference to FIG. 22. In FIG. 22, the memory transistor MTr3 is assumed to be in a write state, and the memory transistor MTr6 is assumed to be in an over-erased state.

If the above-described operation shown in FIG. 21 is executed, there is no channel formed in bodies of the source side select transistor SSTr, the drain side select transistor SDTr, and the memory transistors MTr1-MTr5, MTr7, and MTr8 in the non-selected memory block MB<x>, as shown in FIG. 22. On the other hand, there is a channel formed in bodies of the memory transistor MTr6 and the back gate transistor BTr, respectively. Note that the channel in the body of the memory transistor MTr6 is based on the over-erased state of the memory transistor MTr6.

That is, during the read operation in the nonvolatile semiconductor memory device in accordance with the third embodiment, the voltage Vdd is applied only to a gate of the back gate transistor BTr included in the non-selected memory string MS, thereby making the potential of the body of the back gate transistor BTr lower than that of the others.

[Advantages]

Next, advantages of the third embodiment are described. As shown in FIG. 22, in the non-selected memory block MB<x>, an energy barrier is formed between the source side select transistor SSTr and the source line SL, and between the drain side select transistor SDTr and the bit line BL. These energy barriers enable curbing of a current flowing from the bit line BL to the source line SL via the non-selected memory string MS during the read operation in the nonvolatile semiconductor memory device in accordance with the third embodiment.

Furthermore, in the non-selected memory block MB<x>, a well-type potential is formed in the body of the back gate transistor BTr. Electrons are trapped in this well-type potential, whereby the current flowing from the bit line BL to the source line SL via the non-selected memory string MS during the read operation in the nonvolatile semiconductor memory device in accordance with the third embodiment can be curbed.

In addition, as shown in FIGS. 19 and 20, an occupied area of circuits in the nonvolatile semiconductor memory device in accordance with the third embodiment can be reduced in comparison with that of the first and second embodiments.

Fourth Embodiment

Configuration

Figure 23:
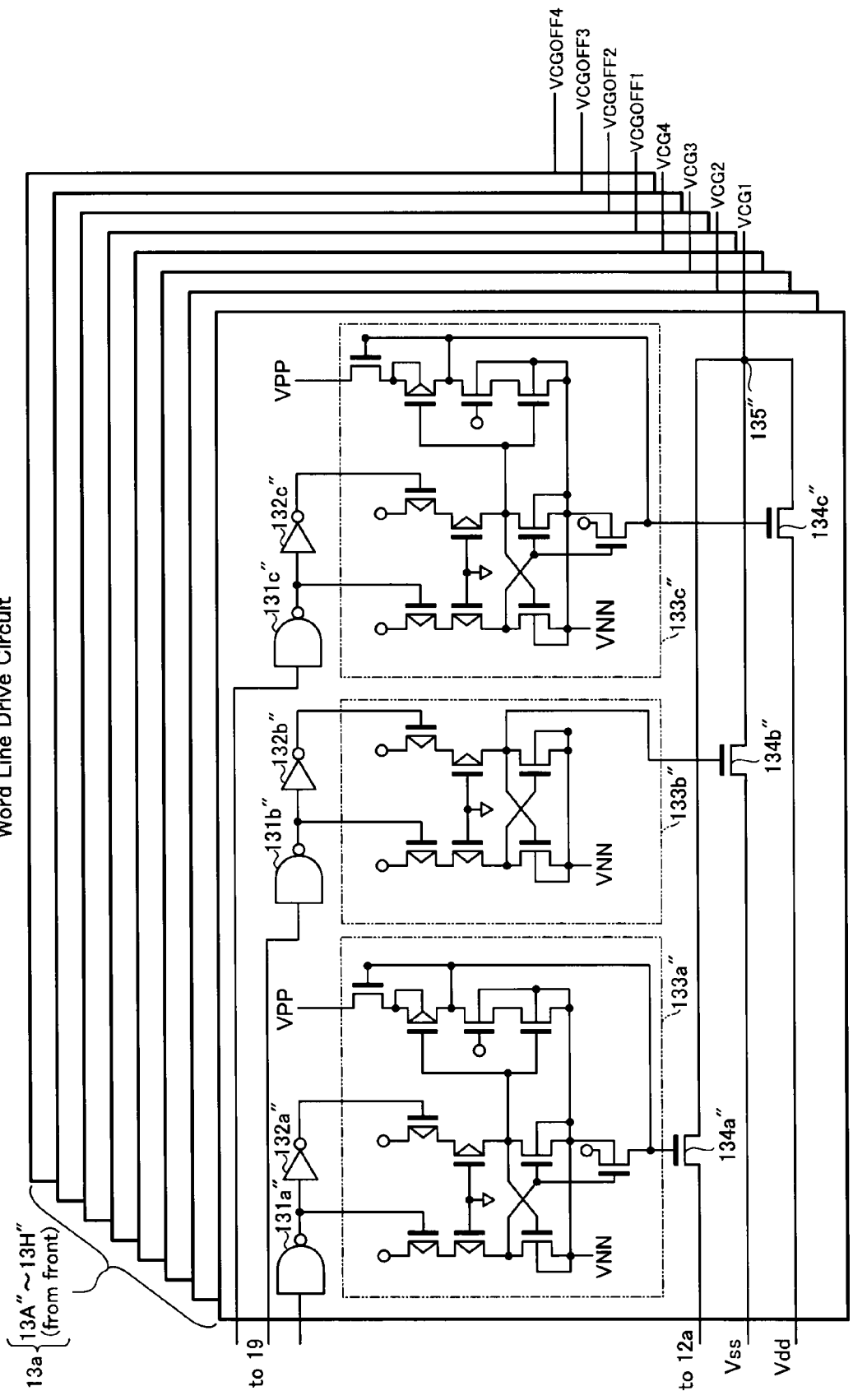
FIG. 23 is a circuit diagram showing a word line drive circuit 13a in accordance with a fourth embodiment.
Figure 24:
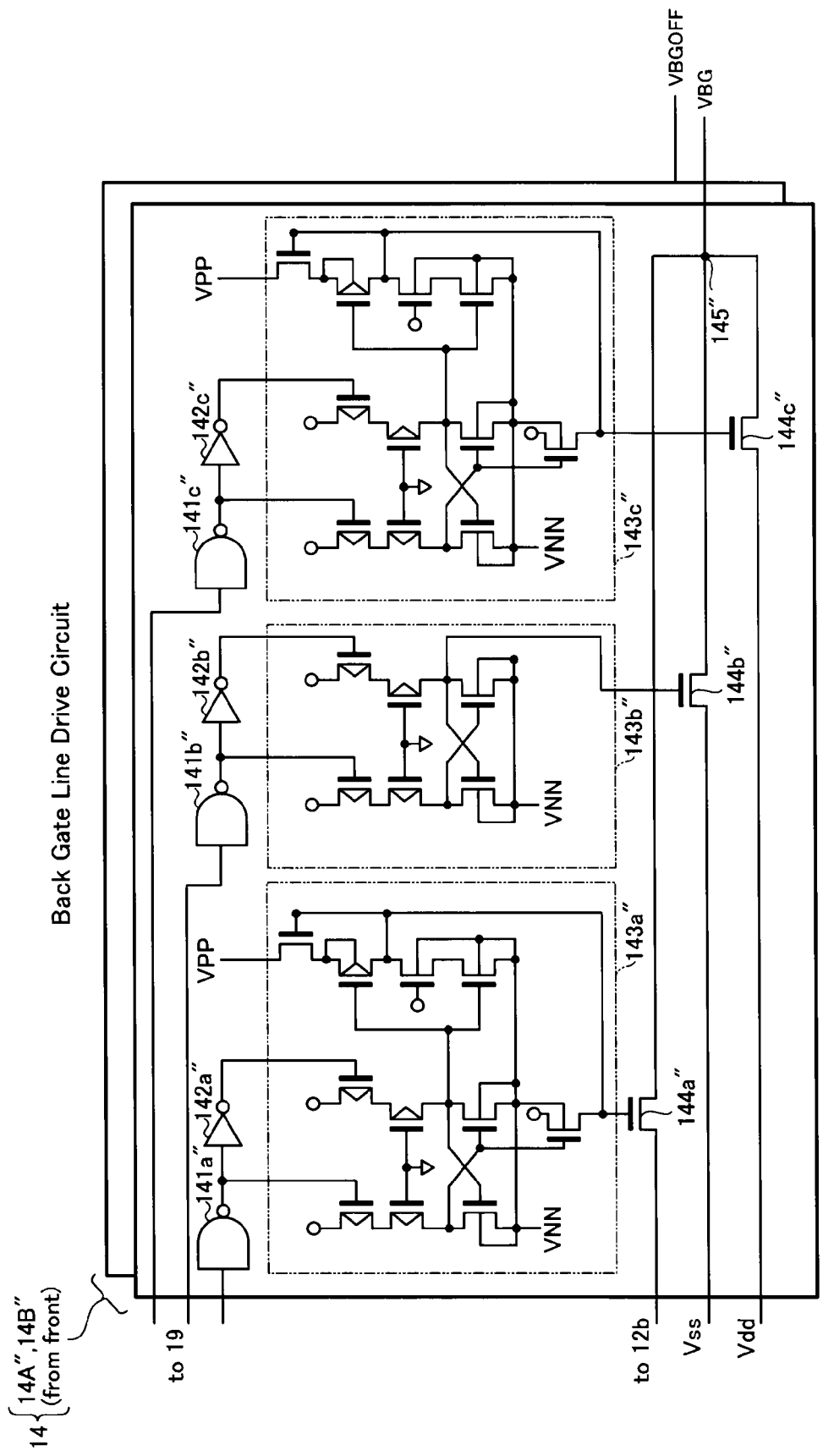
FIG. 24 is a circuit diagram showing a back gate line drive circuit 14 in accordance with the fourth embodiment.

Next, a configuration of a nonvolatile semiconductor memory device in accordance with a fourth embodiment is described with reference to FIGS. 23 and 24. FIG. 23 is a circuit diagram showing a word line drive circuit 13a. FIG. 24 is a circuit diagram showing a back gate line drive circuit 14. Note that in the fourth embodiment, identical symbols are assigned to configurations similar to those in the first through third embodiments and descriptions thereof are omitted.

During a read operation in the nonvolatile semiconductor memory device in accordance with the fourth embodiment, the read pass voltage Vread is applied to a gate of memory transistors MTr included in a non-selected memory string MS, thereby making a potential of bodies of the memory transistors MTr lower than that of the others, similarly to the first embodiment. Furthermore, in the nonvolatile semiconductor memory device in accordance with the fourth embodiment, a voltage VNN is applied to memory transistors MTr and a back gate transistor BTr included in the non-selected memory string MS, thereby making a potential of bodies of the memory transistors MTr and back gate transistor BTr higher than that of the others. Note that the voltage VNN is a negative voltage. To realize such a configuration, the nonvolatile semiconductor memory device in accordance with the fourth embodiment includes boost circuits 12a and 12b, word line drive circuits 13a and 13b, and a back gate line drive circuit 14 which differ from those of the first embodiment.

The boost circuit 12a inputs a signal having the negative voltage VNN to the word line drive circuits 13a and 13b. The boost circuit 12b inputs a signal having the negative voltage VNN to the back gate line drive circuit 14.

As shown in FIG. 23, the word line drive circuit 13a includes first through eighth word line drive circuits 13A"-13H" which differ from those of the first embodiment. Note that the word line drive circuit 13a is mainly described below, since the configuration of the word line drive circuit 13b is similar to that of the word line drive circuit 13a.

The first word line drive circuit 13A" includes NAND circuits 131a"-131c", NOT circuits 132a"-132c", voltage conversion circuits 133a"-133c", and transfer transistors 134a"-134c". The NAND circuits 131a"-131c" each receive a control signal from the sequencer 18. The NAND circuits 131a"-131c" have an output terminal thereof connected to one of input terminals of the voltage conversion circuits 133a"-133c", respectively. In addition, the NAND circuits 131a"-131c" have the output terminal thereof connected via the NOT circuits 132a"-132c" to the other of the input terminals of the voltage conversion circuits 133a"-133c", respectively. The voltage conversion circuits 133a"-133c" have an output terminal thereof connected to a gate of the transfer transistors 134a"-134c", respectively.

The transfer transistor 134a" has one end thereof connected to an output terminal of the boost circuit 12a, and the other end thereof connected to anode 135". Here, the node 135" outputs the signal VCG1. The transfer transistor 134b" has one end thereof connected to the ground voltage Vss, and the other end thereof connected to the node 135". The transfer transistor 134c" has one end thereof connected to the power-supply voltage Vdd, and the other end thereof connected to the node 135". Note that the second through eighth word line drive circuits 13B"-13H" have a similar configuration to the first word line drive circuit 13A".

The back gate line drive circuit 14 includes first and second back gate line drive circuits 14A" and 14B" which differ from those of the first embodiment, as shown in FIG. 24. The first back gate line drive circuit 14A" includes NAND circuits 141a"-141c", NOT circuits 142a"-142c", voltage conversion circuit 143a"-143c", and transfer transistors 144a"-144c". These circuits 141a"-141c", 142a"-142c", and 143a"-143c", and transfer transistors 144a"-144c" have a connectional relationship similar to that of the above-described first word line drive circuit 13A", and a description thereof is thus omitted. Note that the transfer transistor 144a" has one end thereof connected to the output terminal of the boost circuit 12b, and the other end thereof connected to a node 145". The node 145" outputs the signal VBG. Note that the second back gate line drive circuit 14B" has a similar configuration to the first back gate line drive circuit 14A".

[Read Operation]

Figure 25:
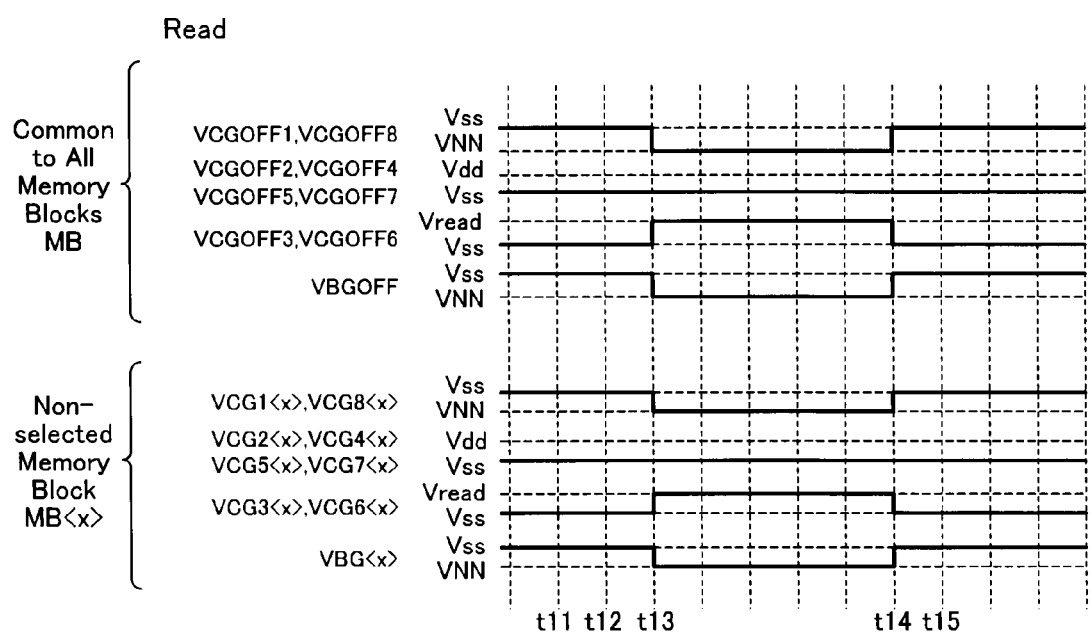
FIG. 25 is a timing chart showing a read operation in accordance with the fourth embodiment.

Next, a read operation in the nonvolatile semiconductor memory device in accordance with the fourth embodiment is described with reference to FIG. 25. FIG. 25 is a timing chart showing the read operation in accordance with the fourth embodiment. In the read operation of the fourth embodiment, only operation in the non-selected memory block MB<x> differs from that of the first embodiment.

Operation in the non-selected memory block MB<x> differs from that of the first through third embodiments in that, at time t13, the signals VCG1<x>, VCG8<x>, and VBG<x> fall to the voltage VNN. In addition, the signals VCG3<x> and VCG6<x> rise to the read pass voltage Vread. Note that the signals VCG2<x>, VCG4<x>, VCG5<x>, and VCG7<x> are held at the ground voltage Vss. The other signals are driven similarly to the first embodiment.

Figure 26:
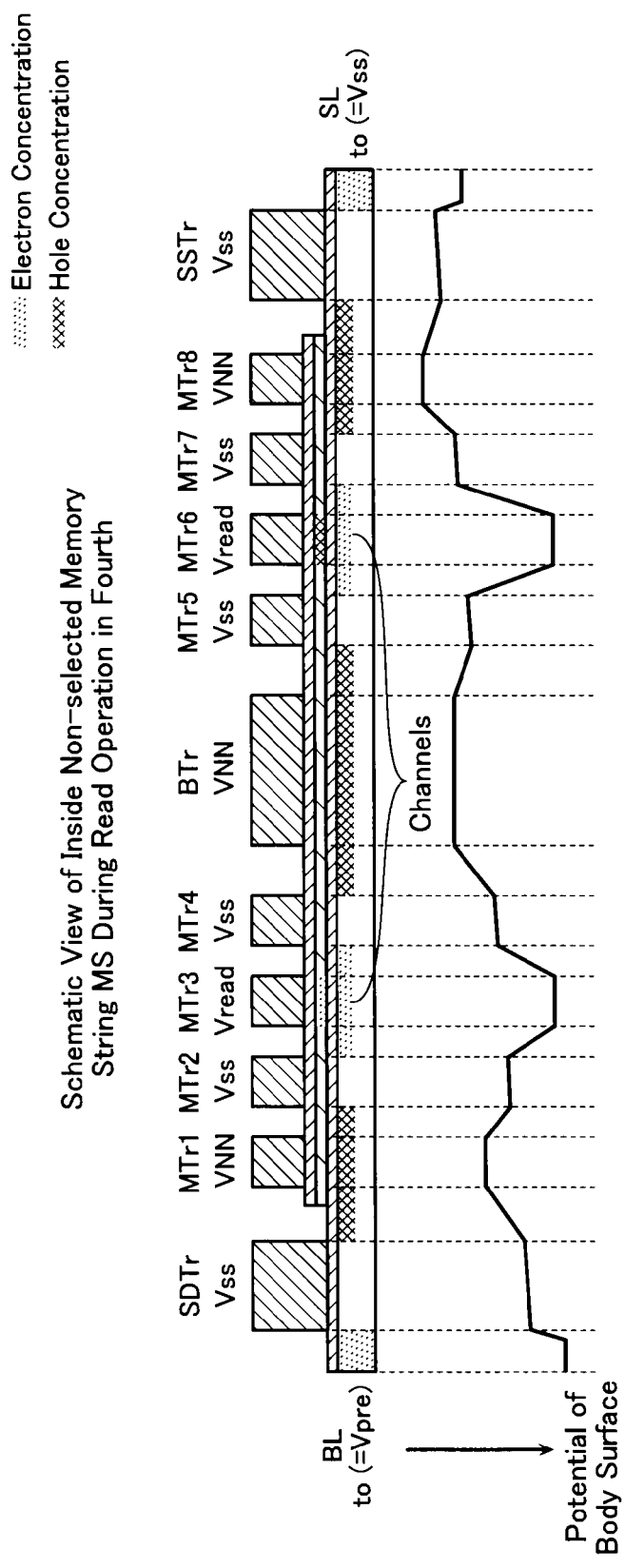
FIG. 26 is a schematic view of the read operation in accordance with the fourth embodiment.

An outline of the above-described read operation in the non-selected memory block MB<x> is now described with reference to FIG. 26. In FIG. 26, the memory transistor MTr3 is assumed to be in a write state, and the memory transistor MTr6 is assumed to be in an over-erased state.

If the above-described operation shown in FIG. 25 is executed, there is no channel formed in bodies of the source side select transistor SSTr, the drain side select transistor SDTr, the memory transistors MTr1, MTr2, MTr4, MTr5, MTr7, and MTr8, and the back gate transistor BTr in the non-selected memory block MB<x>, as shown in FIG. 26. On the other hand, there is a channel formed in bodies of the memory transistors MTr3 and MTr6, respectively. Moreover, a concentration of holes in the bodies of the memory transistors MTr1 and MTr8, and the back gate transistor BTr rises.

That is, during the read operation in the nonvolatile semiconductor memory device in accordance with the fourth embodiment, the voltage Vread is applied to gates of the memory transistors MTr3 and MTr5 in the non-selected memory string MS, thereby making a potential of the bodies of the memory transistors MTr3 and MTr5 lower than that of the others. On the other hand, during the read operation in the nonvolatile semiconductor memory device in accordance with the fourth embodiment, the negative voltage VNN is applied to gates of the memory transistors MTr1 and MTr8, and the back gate transistor BTr in the non-selected memory string MS, thereby making a potential of the bodies of the memory transistors MTr1 and MTr8, and the back gate transistor BTr higher than that of the others. In addition, the gates of the memory transistors MTr2, MTr4, MTr5, and MTr7 are set to the ground voltage Vss so that a gate applied with the voltage VNN is not adjacent to a gate applied with the read pass voltage Vread. This is to prevent occurrence of a large electric field in the body of the memory transistor MTr due to the voltage VNN and the read pass voltage Vread.

[Advantages]

Next, advantages of the fourth embodiment are described. As shown in FIG. 26, in the non-selected memory block MB<x>, an energy barrier is formed between the source side select transistor SSTr and the source line SL, and between the drain side select transistor SDTr and the bit line BL. These energy barriers enable curbing of a current flowing from the bit line BL to the source line SL via the non-selected memory string MS during the read operation in the nonvolatile semiconductor memory device in accordance with the fourth embodiment.

Moreover, in the non-selected memory block MB<x>, a well-type potential is formed in the bodies of the memory transistors MTr3 and MTr6. Electrons are trapped in this well-type potential, whereby the current flowing from the bit line BL to the source line SL can be curbed. Furthermore, the bodies of the memory transistors MTr1 and MTr8, and the back gate transistor BTr constitute a potential barrier. This potential barrier enables curbing of the current flowing from the bit line BL to the source line SL via the non-selected memory string MS during the read operation in the nonvolatile semiconductor memory device in accordance with the fourth embodiment.

Other Embodiments

This concludes description of embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention.

What is claimed is:

1. A nonvolatile semiconductor memory device, comprising:
   a memory cell array having a plurality of memory strings each including a plurality of memory cells connected in series; and
   a control circuit configured to execute a read operation for reading data from the memory cells included in a selected memory string from among the plurality of memory strings,
   each of the memory strings comprising:
   a semiconductor layer having a columnar portion extending in a perpendicular direction with respect to a substrate and functioning as a body of the memory cells;
   a charge storage layer surrounding the columnar portion and holding data by storing a charge; and
   a first conductive layer surrounding the columnar portion with the charge storage layer sandwiched therebetween, extending in parallel to the substrate, and functioning as a gate of the memory cells,
   the control circuit being configured to apply a first voltage to a gate of at least one of the memory cells in a non-selected memory string not subject to the read operation, and apply a second voltage lower than the first voltage to a gate of another of the memory cells in the non-selected memory string not subject to the read operation, during the read operation.

2. The nonvolatile semiconductor memory device according to claim 1,
   wherein the first voltage is a positive voltage rendering the memory cells conductive irrespective of data stored in the memory cells.

3. The nonvolatile semiconductor memory device according to claim 1,
   wherein, during the read operation, the control circuit applies the first voltage to a gate of two or more of the memory cells adjacent to one another in the non-selected memory string, and
   wherein the first voltage is a positive voltage smaller than a read pass voltage rendering the memory cells conductive irrespective of data stored in the memory cells.

4. The nonvolatile semiconductor memory device according to claim 1,
   wherein each of the memory strings comprises a back gate transistor connected between the memory cells,
   wherein each of the memory strings further comprises:
   a joining portion joining lower ends of a pair of the columnar portions in the semiconductor layer and functioning as a body of the back gate transistor; and
   a second conductive layer surrounding the joining portion with the charge storage layer sandwiched therebetween, extending in parallel to the substrate, and functioning as a gate of the back gate transistor, and
   wherein, during the read operation, the control circuit applies the first voltage to the gate of the back gate transistor in the non-selected memory string.

5. The nonvolatile semiconductor memory device according to claim 4, further comprising a third transfer transistor and a fourth transfer transistor each having one end thereof connected to the second conductive layer,
   wherein the third transfer transistor is conductive when the memory string is selected, and
   wherein the fourth transfer transistor is conductive when the memory string is non-selected.

6. The nonvolatile semiconductor memory device according to claim 1,
   wherein the second voltage is a negative voltage.

7. The nonvolatile semiconductor memory device according to claim 1, further comprising a first transfer transistor and a second transfer transistor each having one end thereof connected to the first conductive layer,
   wherein the first transfer transistor is conductive when the memory string is selected, and
   wherein the second transfer transistor is conductive when the memory string is non-selected.

8. The nonvolatile semiconductor memory device according to claim 1,
   wherein, during the read operation, the control circuit applies the first voltage and the second voltage to gates of memory cells in the non-selected memory string in an alternate manner.

9. The nonvolatile semiconductor memory device according to claim 1,
   wherein the second voltage is a ground voltage.

10. The nonvolatile semiconductor memory device according to claim 1,
    wherein, during the read operation, the control circuit applies a third voltage lower than the second voltage to a gate of yet another of the memory cells in the non-selected memory string.

11. The nonvolatile semiconductor memory device according to claim 10,
    wherein, during the read operation, the control circuit applies the first voltage to a gate of an n-th memory cell in the non-selected memory string, applies the second voltage to a gate of an (n+1)-th memory cell in the non-selected memory string, and applies the third voltage to a gate of an (n+2)-th memory cell in the non-selected memory string.

12. The nonvolatile semiconductor memory device according to claim 10,
    wherein the first voltage is a positive voltage configured to render the at least one of the memory cells conductive irrespective of data stored in the at least one of the memory cells,
    wherein the second voltage is a ground voltage, and
    wherein the third voltage is a negative voltage.

13. A nonvolatile semiconductor memory device, comprising:
    a memory cell array having a plurality of memory strings each including a plurality of memory cells connected in series; and
    a control circuit configured to execute a read operation for reading data from the memory cells included in a selected memory string from among the plurality of memory strings,
    each of the memory strings comprising:
    a semiconductor layer having a columnar portion extending in a perpendicular direction with respect to a substrate and functioning as a body of the memory cells;
    a charge storage layer surrounding the columnar portion and holding data by storing a charge;
    a first conductive layer surrounding the columnar portion with the charge storage layer sandwiched therebetween, extending in parallel to the substrate, and functioning as a gate of the memory cells;
    a joining portion joining lower ends of a pair of the columnar portions in the semiconductor layer and functioning as a body of a back gate transistor; and
    a second conductive layer surrounding the joining portion with the charge storage layer sandwiched therebetween, extending in parallel to the substrate, and functioning as a gate of the back gate transistor,
    the control circuit being configured to apply a first voltage to a gate of the back gate transistor in a non-selected memory string not subject to the read operation, and apply a second voltage lower than the first voltage to a gate of the memory cells in the non-selected memory string not subject to the read operation, during the read operation.

14. The nonvolatile semiconductor memory device according to claim 13,
    wherein the first voltage is a positive voltage smaller than a read pass voltage rendering the memory cells conductive irrespective of data stored in the memory cells.

15. The nonvolatile semiconductor memory device according to claim 13,
    wherein the second voltage is a ground voltage.

16. The nonvolatile semiconductor memory device according to claim 13, further comprising:
    a first transfer transistor having one end thereof connected to the first conductive layer; and
    a second transfer transistor and a third transfer transistor each having one end thereof connected to the second conductive layer,
    wherein the first transfer transistor is conductive when the memory string is selected,
    wherein the second transfer transistor is conductive when the memory string is non-selected, and
    wherein the third transfer transistor is conductive when the memory string is non-selected.

17. A method of data read in a nonvolatile semiconductor memory device, the nonvolatile semiconductor memory device comprising a memory cell array having a plurality of memory strings each including a plurality of memory cells connected in series, each of the memory strings comprising: a semiconductor layer having a columnar portion extending in a perpendicular direction with respect to a substrate and functioning as a body of the memory cells; a charge storage layer surrounding the columnar portion and holding data by storing a charge; and a first conductive layer surrounding the columnar portion with the charge storage layer sandwiched therebetween, extending in parallel to the substrate, and functioning as a gate of the memory cells, the method comprising:

applying a first voltage to a gate of at least one of the memory cells in a non-selected memory string not subject to a read operation, and applying a second voltage lower than the first voltage to a gate of another of the memory cells in the non-selected memory string not subject to the read operation, during execution of the read operation for reading data from the memory cells included in a selected memory string from among the plurality of memory strings.

18. The method of data read in a nonvolatile semiconductor memory device according to claim 17,
wherein the first voltage is a positive voltage rendering the memory cells conductive irrespective of data stored in the at least one of the memory cells.

19. The method of data read in a nonvolatile semiconductor memory device according to claim 17,
wherein, during the read operation, the first voltage is applied to a gate of two or more of the memory cells adjacent to one another in the non-selected memory string, and wherein the first voltage is a positive voltage smaller than a read pass voltage and configured to render the memory cells conductive irrespective of data stored in the memory cells.

20. The method of data read in a nonvolatile semiconductor memory device according to claim 17,
wherein each of the memory strings comprises a back gate transistor connected between the memory cells,
wherein each of the memory strings further comprises:
a joining portion joining lower ends of a pair of the columnar portions in the semiconductor layer and functioning as a body of the back gate transistor; and
a second conductive layer surrounding the joining portion with the charge storage layer sandwiched therebetween, extending in parallel to the substrate, and functioning as a gate of the back gate transistor, and
wherein, during the read operation, the first voltage is applied to the gate of the back gate transistor in the non-selected memory string.

* * * * *